United States Patent [19]

Rast et al.

[11] 4,031,549

[45] June 21, 1977

[54] TELEVISION TUNING SYSTEM WITH PROVISIONS FOR RECEIVING RF CARRIER AT NONSTANDARD FREQUENCY

[75] Inventors: Robert Morgan Rast, Mercerville; Charles Martin Wine; John Goodchilde Norie Henderson, both of Princeton, all of N.J.

[73] Assignee: RCA Corporation, New York, N.Y.

[22] Filed: May 21, 1976

[21] Appl. No.: 688,521

[52] U.S. Cl. .............................. 358/193; 325/419; 325/423; 325/470; 358/195
[51] Int. Cl.² ...................... H04N 5/50; H04B 1/26
[58] Field of Search .......... 325/308, 418, 419, 420, 325/421, 422, 423, 453, 464, 468, 469, 470; 334/16; 331/10, 14, 17, 34; 358/191, 193, 195; 178/DIG. 13

[56] References Cited

UNITED STATES PATENTS

| | | | |
|---|---|---|---|
| 3,411,103 | 11/1968 | Deman et al. | 325/421 |
| 3,949,158 | 4/1976 | Rzeszewski et al. | 325/423 |

Primary Examiner—Robert L. Richardson
Assistant Examiner—Marc E. Bookbinder
Attorney, Agent, or Firm—Eugene M. Whitacre; Peter M. Emanuel

[57] ABSTRACT

A tuning system for a television receiver includes a phase locked loop for tuning a local oscillator to the nominal local oscillator frequencies required to tune the receiver to RF carriers at standard broadcast frequencies allocated to the various channels a viewer may select. The tuning system also includes an automatic fine tuning (AFT) frequency discriminator for tuning the local oscillator to minimize any deviation between the frequency of an actual picture carrier and the nominal picture carrier frequency. If the receiver is coupled to a television distribution system which provides RF carriers having nonstandard frequencies arbitrarily near respective ones of the standard broadcast frequencies, when the phase locked loop has achieved lock at a nominal frequency, a mode control unit selectively couples the discriminator and a frequency drift control circuit to the local oscillator. If the frequency of the local oscillator drifts more than a predetermined offset from the frequency synthesized under phase locked loop control because no carrier has been detected by the discriminator, discriminator and drift control are terminated so that the receiver will not be tuned to an undesired carrier such as, for example, the lower adjacent channel sound carrier, and phase locked loop control is reinitiated to synthesize a local oscillator signal having a frequency different from the frequency of the originally synthesized local oscillator signal by a predetermined amount. After the phase locked loop is locked at the new frequency, discriminator control is again initiated.

14 Claims, 12 Drawing Figures

TELEVISION TUNING SYSTEM WITH PROVISIONS FOR RECEIVING RF CARRIER AT NONSTANDARD FREQUENCY

The present apparatus is directed to television channel tuning system sand is particularly directed to a tuning system including a phase locked loop frequency synthesizer.

Recently, frequency synthesizers including a phase locked loop (PLL) have been suggested to accurately generate local oscillator signals at predetermined frequencies appropriate for receiving the various broadcast channels which a viewer may select. For example, tuning apparatus utilizing a phase locked loop is described in the Digital Integrated Circuits Application Note ICAN-6716 entitled, "Low-Power Digital Frequency Synthesizer Utilizing COS/MOS IC's", by R. E. Funk appearing in the 1972 RCA Solid State Databook on COS/MOS Digital Integrated Circuits (SSD-203) published by RCA Corporation.

Although such frequency syntheszier apparatus is known for tuning to standard frequency broadcast carriers, not all television signals are transmitted on standard broadcast frequencies. In some distribution systems, such as those using community antenna (CATV) or apartment house and motel master antenna (MATV) installations, cables are used to distribute television signals having radio frequency (RF) carriers which may be translated in frequency with respect to the standard frequency broadcast carriers. The translated non-standard frequency carrier may not meet FCC (Federal Communications Commission) broadcast frequency standards, e.g., in an MATV environment the frequency deviation may be as much as ±2 MHz of the standard carrier frequency. It is therefore desirable to provide apparatus for tuning receivers to non-standard frequency carriers as well as to standard frequency carriers.

One such apparatus, described in U.S Patent application Ser. No. 662,096 filed in the name of Robert Morgan Rast on Feb. 27, 1976, and assigned to the same assignee as the present invention, includes a phase locked loop configuration for tuning a local oscillator to the nominal local oscillator frequencies required to receive standard frequency carriers and another phase locked loop configuration whose operation is selectively initiated to minimize the frequency deviation between the frequency of an actual picture carrier and the nominal frequency of a picture carrier when the receiver is coupled to a television distribution system providing carriers at non-standard frequencies. Because an actual picture carrier may be outside of the asymmetrical passband of the intermediate frequency portion of the receiver, provisions are included for decrementing the local oscillator frequency by an amount sufficient to being a picture carrier associated with a nonstandard frequency carrier within the passband of the IF portion.

Another tuning apparatus which may be utilized for tuning a television receiver to both standard frequency carriers and nonstandard frequency carriers, described in U.S. Patent application Ser. No. 632,060 filed in the name of John Goodchilde Norie Henderson on Nov. 14, 1975, and assigned to the same assignee as the present invention, includes a phase locked loop configuration for synthesizing the nominal local oscillator frequencies required to tune the receiver to standard frequency broadcast carriers. When the receiver is coupled to a television distribution system providing non-standard frequency carriers, the frequency of the local oscillator is scanned in a predetermined frequency range including the nominal local oscillator frequency for the selected channel. As the local oscillator frequency is scanned, frequency discriminator generates a signal representing the deviation between the actual picture carrier and the nominal picture carrier frequency. The signal provided by the discriminator is processed to form a control signal which is coupled to the local oscillator instead of the control signal provided by the phase locked loop when the deviation between the frequency of the actual picture carrier and 45.75 MHz is within a predetermined range corresponding to the control range of the discriminator and when the amplitude of the discriminator derived control signal substantially equals the amplitude of the phase locked loop derived control signal for the selected channel.

The present tuning system includes first means, e.g., a phase locked loop configuration, for tuning a local oscillator to the nominal frequencies required to tune the receiver to the standard frequency carriers allocated to the various channels a viewer may select. The tuning system also includes second means, e.g., an AFT discriminator, for tuning the local oscillator to minimize a deviation between the frequency of a picture carrier and the nominal picture carrier frequency when the receiver is coupled to a television signal distribution system providing non-standard frequency carriers. When the receiver is receiving non-standard frequency carriers, mode control means initially couple the phase locked loop configuration to the local oscillator. When the phase locked loop configuration is locked, the mode control means decouples the phase locked loop configuration from the local oscillator and couples the AFT discriminator to the local oscillator instead. While the local oscillator is under discriminator control, an offset detector evaluates the offset between the local oscillator frequency and the local oscillator frequency originally synthesized by the phase locked loop configuration. If the frequency of the local oscillator drifts beyond a predetermined offset from the originally synthesized local oscillator frequency because no carrier has been detected by the discriminator, the mode control means returns local oscillator control to the phase locked loop configuration. Simultaneously, the phase locked loop configuration is caused to synthesize a local oscillator frequency at a predetermined increment from the originally synthesized local oscillator frequency. Discriminator control is again initiated by the mode control means when the phase locked loop configuration is again locked. If during any discriminator control cycle, the discriminator detects a carrier within the predetermined offset, it will tune the local oscillator to minimize the deviation between the frequency of the carrier and the nominal IF picture carrier frequency. As a result, the frequency of the local oscillator will not drift beyond the predetermined offset from the local oscillator frequency synthesized in the previous phase locked loop control cycle and the tuning sequence is terminated.

The mode control means may initiate another phase locked loop control cycle during which the phase locked loop configuration is caused to synthesize a local oscillator frequency at another predetermined increment from the originally synthesized local oscillator frequency if the tuning sequence has not been terminated during the first or second discriminator control cycles.

By selecting the predetermined offset and frequency increments by which the local oscillator frequency is stepped, the receiver may be turned to non-standard frequency carriers having frequencies further from respective ones of the standard broadcast frequencies than the specified control range of the conventional AFT discriminators which may be employed with the present tuning apparatus while ensuring that the discriminator will not tune the receiver for a selected channel to undesirable carriers such as the co-channel sound carrier, the adjacent channel sound carrier or the adjacent channel picture carrier.

Furthermore, by selecting the first increment to be positive and the second negative, the chances of tuning the receiver to the lower adjacent channel sound carrier are minimized.

Still further, a bias signal source may be coupled to the local oscillator simultaneously with the discriminator output to cause the frequency of the local oscillator to drift in a predetermined direction so that the local oscillator will not remain tuned to a frequency for which there is no associated picture carrier within the predetermined offset.

These and other features of the present tuning system will best be understood by reference to the following detailed description and accompanying drawings in which.

Figure 1:
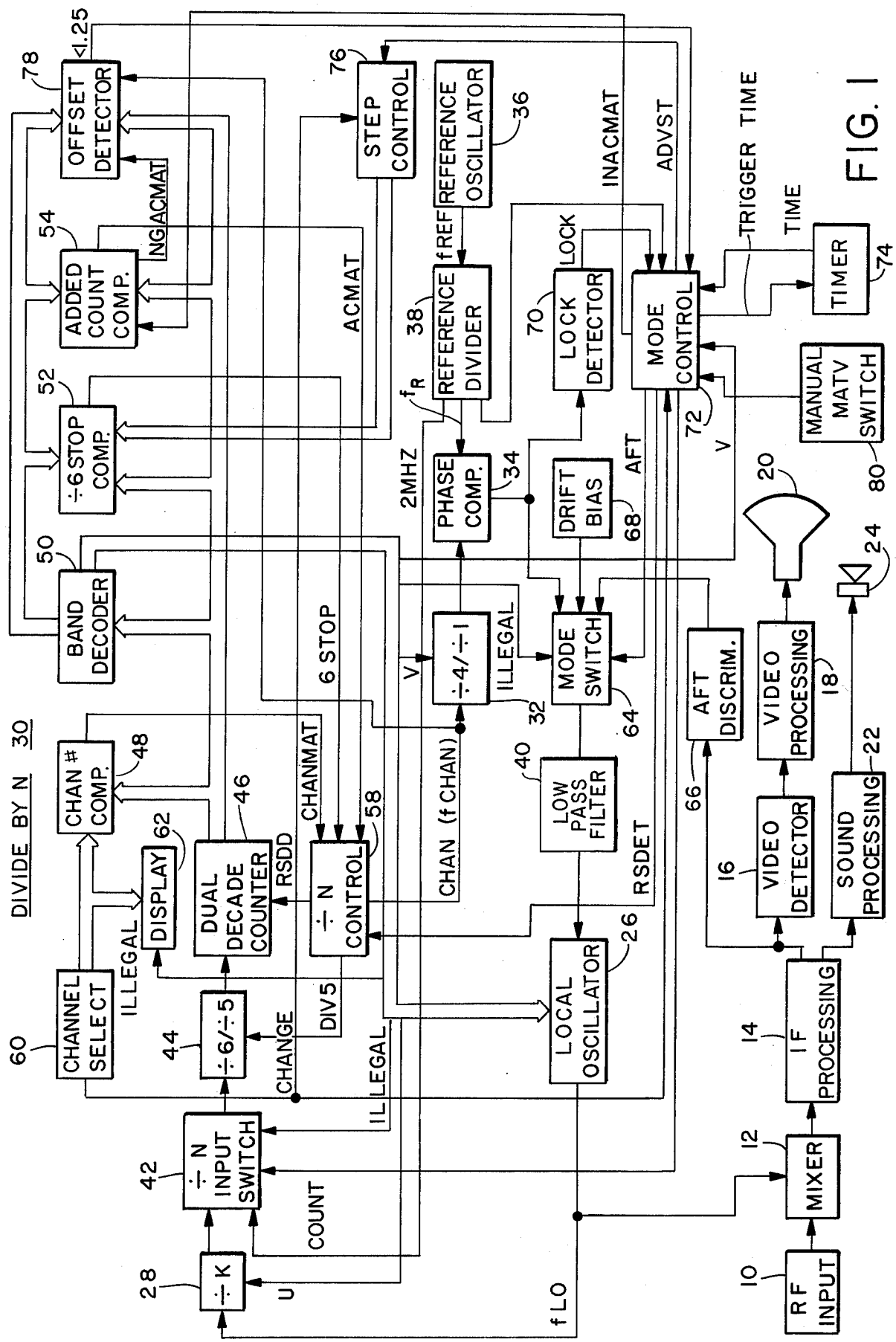
FIG. 1 shows a block diagram of a television receiver employing the present tuning system.

In the television receiver of FIG. 1, television signals are received by an RF input unit 10. RF input unit 10 may comprise an antenna for receiving television signals having modulated radio frequency (RF) carriers at standard broadcast frequencies allocated to the various channels a viewer may select. Alternately, RF input unit 10 may comprise a system in which television signals having modulated RF carriers at standard frequencies are received and frequency translated so as to provide television signals having modulated carriers at non-standard frequencies arbitrarily near respective ones of the standard frequencies. For example, RF input unit 10 may comprise a master antenna television (MATV) distribution system in which television signals having standard frequency RF carriers are received by a master antenna and distributed through cables to the various units of a motel or apartment complex as television signals having non-standard frequency carriers as far as ±2 MHz from respective ones of the standard frequency carriers.

RF carriers provided by RF input unit 10 are coupled to a mixer 12 where they are combined with local oscillator signals generated by a local oscillator 26 to form intermediate frequency (IF) signals including picture, color and sound carriers. The IF signals are coupled to an IF processing unit 14 where they are filtered and amplified. The signals processed by IF processing unit 14 are coupled to a video detector 16 which derives luminance, chrominance and synchronization signals from them. A video processing unit 18 processes the chrominance, luminance and synchronization signals to form an image on kinescope 20. A sound processing unit 22 is coupled to IF processing unit 14 to derive sound signals which are in turn coupled to a speaker 24 from the intermediate frequency signals.

Portions of the receiver of FIG. 1 thus far described may, for example, be similar to portions of the receiver described in the "RCA Television Service Data, File 1975 C-5" for the RCA CTC-74 television receiver published by the RCA Corporation, Indianapolis, Indiana.

The tuning system of the receiver shown in FIG. 1 includes a phase locked loop configuration for synthesizing local oscillator signals having nominal frequencies appropriate for receiving the standard frequency broadcast carriers allocated to the various channels a viewer may select. When RF input system provides standard frequency carriers, mixer 12 combines them with respective ones of the nominal frequency local oscillator signals to form intermediate frequency signals having a picture carrier at a frequency substantially equal to the nominal IF picture carrier frequency, e.g., in the United States, 45.75 MHz. The phase locked loop configuration includes a local oscillator 26, a divide by K prescaler 28, a divide by N input switch 42, a divide by N unit 30, a divide by 4/divide by 1 divider 32, a phase comparator 34, a reference oscillator 36, a reference oscillator 36, a reference divider 38 and a low pass filter 40 and a mode switch 64.

Local oscillator 26, which typically is a voltage controlled oscillator, generates a local oscillator signal having a frequency controlled in accordance with the DC voltage applied to it from low pass filter 40. Local oscillator 26, for example, may be of a type similar to that described in the Service Data referred to above employing an array of varactor diodes.

The output of local oscillator 26 is coupled to divide by K prescaler 28 which divides the frequency (e.g., in the range of 101 to 931 MHz in the United States) of the relatively high frequency local oscillator signals by a factor K to produce signals whose frequency is compatible with the operating frequency range of the portions of the tuning system following it. The factor K is controlled in accordance with the band in which the selected channel resides. For channels in the UHF (ultra high frequency) range, for example, K is equal to 256 while in the VHF (very high frequency) range K is equal to 64.

The output of divide by K prescaler 28 is selectively coupled by divide by N input switch 42, whose function will subsequently be explained, to a divide by N unit 30. Divide by N unit 30 comprises a dual modulus divider 44, a dual decade counter 46, a channel number comparator 48, a band decoder 50, a divide by 6 stop comparator 52, an added count comparator 54, an offset detector 56, and a divide by N control unit 78, the interaction of which will subsequently be described. Divide by N unit 30 performs a number of functions. One of these functions is to divide the frequency of the output signal of divide by K prescaler 28 by a number N equal to the frequency in megahertz of the nominal local oscillator signal. The number N is controlled in accordance with the channel a viewer selects via a channel selection unit 60.

Channel selection unit 60 may, for example, comprise a calculator type keyboard by which a viewer may sequentially select the two decimal digits comprising a channel number. Channel selection unit 60 converts the selected two digit decimal number into binary signals arranged, for example, in a binary coded decimal (BCD) format. The binary signals are partitioned into a group, e.g., of 4 bits (binary digits) for the most significant digit (MSD) and another group, e.g., of 4 bits for the least significant digit (LSD). The binary signals are coupled to channel number comparator 48 of divide by N unit 30 and are also coupled to a display unit 62 which provides the viewer with a visual indication of the channel he has selected.

Band decoder 50 of divide by N unit 30 determines the frequency band in which the selected channel resides. A binary signal U indicating that the selected channel is in the UHF range is coupled to divide by K prescaler 28 from band decoder 50 to control the number K. Furthermore, band decoder 50 couples either a $V_L$, $V_H$ or a U binary signal, indicating that the selected channel is in the VHF band corresponding to channels 2-6, the VHF band corresponding to channels 7-13, or the UHF range, respectively, to local oscillator 26 to control which of its varactor diodes are energized to thereby control its frequency range.

The output of divide by N unit 30 (the CHAN output of divide by N control unit 58) is coupled to a divide by 4/divided by 1 divider 32 divides the frequency of the output signal of divide by N unit 30 by 4 for UHF channels and by 1 for VHF channels in accordance with the state of the V binary signal coupled to it from band decoder 50. The output of divide by 4/divide by 1 divider 32 is coupled to phase comparator 34 which provides an output signal comprising a series of pulses whose polarity and duty cycle represent the phase and/or frequency deviation between the output signal of the divide by 4/divide by 1 divider 32 and the output signal of reference divider 38.

The output of phase comparator 34 is selectively coupled via mode switch 64 to an active low pass filter 40. Low pass filter 40 serves to integrate the output signal of phase comparator 34 to form a DC signal which controls the frequency of local oscillator 26.

The loop just described is arranged so that low pass filter 40 couples a DC voltage to local oscillator 26 which tends to minimize the frequency and phase differences between the output signals are equal in frequency, the frequency of the local oscillator, $f_{LO}$, is given by the expression:

$$f_{LO} = (NKM/R)f_{REF} \qquad (1)$$

where $f_{REF}$ is the frequency of the output signal of reference oscillator 36, K is the factor by which prescaler 28 divides (256 for UHF channels and 64 for VHF channels), N is the frequency in megahertz of the desired local oscillator signal, M is the factor by which the divide by 4/divide by 1 divider 32 divides (4 for UHF channels and 1 for VHF channels and R is the factor by which reference divider 38 divides. From expression (1) it can be seen that if frequency, $f_{REF}$, of the output signal reference oscillator 36 is 4 MHz and reference divider 38 divides the 4 MHz signal by R = 1024 (a division factor readily obtainable with a binary counter) to provide a reference frequency equal to 3.90625 kHz, all the nominal local oscillator frequencies for the various channels in the United States may be synthesized.

The local oscillator frequencies synthesized by the phase locked loop configuration just described, when combined with standard frequency carriers in mixer 12, form IF signals having a picture carrier at the nominal IF picture carrier frequency, i.e., in the United States, for example, at 45.75 MHz. However, if the RF carriers provided by RF input 10 are not at standard frequencies, the IF signal will have a picture carrier at a frequency spaced from the nominal picture carrier frequency by an amount corresponding to the frequency deviation between the standard RF carrier frequency and nonstandard RF carrier frequency received for the particular channel selected. Therefore, to accommodate the tuning of nonstandard frequency carriers, the tuning system of FIGURE 1 includes an automatic fine tuning (AFT) frequency discriminator 66 and a drift bias unit 68 which are selectively coupled to mode switch 64 to low pass filter 40 in response to signals generated by a mode control unit 72, a lock detector 70, a timer unit 74, an offset detector 78 and a step control unit 76 provided in association with AFT discriminator 66 in accordance with a predetermined tuning algorithm.

As will be clear from the following description, the nonstandard frequency tuning of the present tuning system will operate to tune the receiver to standard as well as nonstandard carriers. Nevertheless, a manual MATV switch 80 is coupled to mode control unit 72 so that when a viewer knows he is receiving only standard frequency RF carriers, he may manually disable the nonstandard frequency tuning portion of the tuning system. In the following description it is assumed that the non-standard frequency tuning portion of the tuning system has been enabled.

When a viewer selects a new channel by means of channel selection unit 60, channel selection unit 60 generates a CHANGE binary signal to reset the tuning system. The phase locked loop thereafter synthesizes the nominal local oscillator frequency for the selected channel. Lock detector 70 is coupled to phase comparator 34 to determine when the frequency of the output signal of divide by 4/divide by 1 divider 32 is within a predetermined phase and/or frequency deviation from the output signal of reference divider 38 and in this manner determine when the phase locked loop is locked. When the phase locked loop is locked, mode control unit 72 generates an AFT binary signal to cause mode switch 64 to decouple the output of the phase locked loop, i.e., the output of phase comparator 34 from low pass filter 40 and to couple the output of discriminator 66 to low pass filter 40 instead.

AFT discriminator 66 provides an error voltage representative of the deviation between the frequency of an actual picture carrier and the nominal picture carrier frequency to control the frequency of local oscillator 26 so that the deviation is reduced. AFT discriminator 66 may comprise, for example, the type of AFT frequency discriminator utilized in the color redeiver described in the RCA Service Data referenced above which provides an S-shaped error voltage versus frequency deviation characteristic over a predetermined frequency control range. Although the frequency control range of commonly used AFT discriminators are typically specified to be ±1 MHz of the nominal picture carrier frequency, e.g., in the United States, 45.75 MHz, they in fact frequently are able to pull in and lock on to a carrier separated from the nominal carrier frequency by as much as 2 or even 3 MHz. Therefore, it is quite conceivable that AFT discriminator 66 could minimize deviations between the frequency of a picture carrier and 45.75 MHz as large as ±2 MHz due to a corrresponding frequency deviation between a non-standard frequency carrier, provided, for example, by an MATV distribution system, and its associated standard frequency carrier.

Unfortunately, AFT discriminator 66 may be able to pull in undesirable carriers such as the sound carrier of the next lower channel (i.e., the lower adjacent channel sound carrier) which for example, in the United States is only 1.5 MHz above (in the IF range) the picture carrier of the selected channel. Under some conditions, it may even be possible for discriminator 66 to pull in the sound carrier of the selected channel (i.e., the co-channel sound carrier) which is 4.5 MHz below the picture carrier of the selected channel (in the IF range). It is noted that the ability of an AFT discriminator to pull in undesirable carriers is inhibited in conventional varactor television tuning systems by the IF filter traps and because a DC reference voltage corresponding to the selected channels is added to the error voltage provided by the discriminator and, in essence, limits its pull in range.

In the present tuning apparatus, in order to inhibit the ability of AFT discriminator 66 to pull in undesirable carriers, offset detector 78 is provided to determine if the frequency of local oscillator 26 has drifted further than a predetermined offset from its frequency originally synthesized under phase locked loop control. For the particular tuning arrangement described, the offset is desirably selected as 1.25 MHz because it is less than the nearest undesirable carrier, i.e., the lower adjacent sound carrier which is 1.5 MHz below the picture carrier of the selected channel, and slightly greater than the specified pull-in range of AFT discriminator 66, i.e., ±1 MHz, so as to allow a margin for overshooting the picture carrier to be pulled in. Furthermore, as will be seen, a frequency offset of 1.25 MHz is readily detectable with the logic implementations of the tuning system shown in FIGS. 3–7. If offset detector 78 determines that the frequency that the frequency of local oscillator 26 has drifted more than 1.25 MHz from the frequency synthesized under phase locked loop control, it generates a $<\overline{1.25}$ (not less than 1.25 MHz) binary signal. In response, mode control unit 72 generates an $\overline{AFT}$ binary signal which causes mode switch 64 to decouple the output of AFT discriminator 66 from low pass filter 40 and to couple the output of phase comparator 34 to low pass filter 40 instead, thereby initiating phase locked loop control.

When the output of the phase locked loop configuration is decoupled from low pass filter 40 and AFT discriminator 66 is coupled to it instead, mode control 72 generates a binary signal TRIGGER TIME to enable drift timer 74. Drift timer 74, which may, for example, include a resistor and capacitor dicharge timing network, generates a signal TIME at the end of a predetermined time interval. If offset detector 78 at any time during the predetermined time interval generates a $<\overline{1.25}$ binary signal, mode control unit 72 generates an ADVST (advance step) binary signal which is coupled to step control unit 76. Thus, if during the predetermined time interval a $<\overline{1.25}$ signal is generated, phase lock loop control is initiated and an ADVST signal is generated. If a $\overline{1.25}$ signal is generated after the predetermined time interval, phase lock loop control is initiated but an ADVST signal is not generated.

In response to an ADVST signal from mode control unit 72, step control unit 76 causes the factor N to be incremented by 1 from its original or nominal value. As a result, the phase locked loop causes the frequency of the local oscillator signal to be incremented by 1 MHz from its nominal frequency for the selected channel. This in turn would cause the IF frequency of the picture carrier, if one exists for the selected channel, to be shifted by +1 MHz.

When the phase locked loop again attains lock, as determined from the LOCK output signal of lock detector 70, discriminator control is again initiated and the operation described above is repeated. However, if during this cycle of discriminator contol, an ADVST signal is generated by mode control unit 72 in response to the generation of a $<\overline{1.25}$ MHz signal by offset detector 78 at any time during the predetermined time interval, step control unit 76 causes the value of N to be decremented by 1 from its nominal value. Thereafter, one more sequence of a phase locked loop control cycle, wherein the local oscillator is caused to have a frequency of 1 MHz lower than its nominal value for the selected channel, followed by a discriminator control cycle take place. If offset detector 78 generates a $<\overline{1.25}$ signal at any time during the predetermined time interval in the last discriminator control cycle, mode control unit 72 returns local oscillator 26 to phase lock loop control and returns N to its nominal value. Thereafter, the above described tuning algorithm will be repeated because no picture carrier for the selected channel exists, until the viewer selects another channel.

If a picture carrier exists for the selected channel, in one of the three discriminator control cycles, offset detector 78 generates a <1.25 signal during the entire predetermined time interval. That is, if a picture carrier exists for the selected channel, it will be tuned in either the first discriminator control cycle for which the frequency of the local oscillator is initially set to its nominal value, the second discriminator control cycle for which the frequency of the local oscillator is initially set to its nominal value plus 1 MHz, or the third discriminator control cycle for which the frequency of the local oscillator is initially set to its nominal value minus 1 MHz. In response, mode control unit 72 will cause local oscillator 26 to remain under discriminator control and inhibits the generation of an ADVST signal so that N cannot thereafter be incremented or decremented (except when a new channel is selected).

If a $<\overline{1.25}$ signal is generated by offset detector 78 after the predetermined time interval, i.e., after a picture carrier for the selected channel has been tuned under discriminator control, because the local oscillator frequency has been drifted more than 1.25 MHz from the local oscillator frequency synthesized during the previous phase locked loop cycle due to the temporary loss of carrier signal resulting from, for example, interference by a passing airplane (airplane flutter), or the like, mode control unit 72 will return control of local oscillator 26 to the phase locked loop. However, because step control unit 76 has been inhibited from either incrementing or decrementing the number N, when the phase locked loop is locked, N will have the value for which the picture carrier was located and tuned prior to the temporary loss of carrier. As a result, the time required to tune local oscillator 26 after a momentary signal dropout will be minimized, and the system will have been prevented from erroneous tuning an undesirable carrier, e.g., the lower adjacent channel sound carrier.

Because the closest undesired carrier to the desired picture carrier is the lower adjacent sound carrier which, for example, for frequency allocations in the United States, is 1.50 MHz above the picture carrier (in the IF frequency range), in the tuning sequence the local oscillator is first incremented rather than decremented to move an undesired lower adjacent sound carrier 1 MHz further away from the desired control range of discriminator 66. In other words, the frequency regions in which there is less likely to be an undesired carrier to which discriminator 66 can tune local oscillator 26 are searched before the frequency regions in which there is more likely to be an undesired carrier, to minimize the possibility of tuning the receiver to an undersired carrier.

In the absence of a picture carrier (or any other carrier), the conventional type of AFT discriminator which may be utilized as discriminator 66 may remain in a substantially balanced condition. Under these circumstances, the frequency of local oscillator 26 may not drift further than 1.25 MHz from the previously synthesized local oscillator frequency during the predetermined time interval and, as a result, a <1.25 signal will be generated during the entire predetermined time interval causing the tuning system to terminate its searching operation, as previously described, although, in fact, a picture carrier has not been tuned. To overcome this situation, mode switch 64 couples drift bias unit 68 to the input of low pass filter 40 substantially at the same time it couples discriminator 66 to the input of low pass filter 40. Drift bias unit 68 comprises a source of fixed DC voltage. When the DC voltage is coupled to low pass filter 40, it is integrated to form a ramp signal which causes local oscillator 26 to be swept in a predetermined direction. If no carrier is encountered during the predetermined time interval, a $\overline{<1.25}$ signal will be generated when the frequency of local oscillator 26 has been swept 1.25 MHz (as it should be) and the tuning sequence continues as described above. The upper limit on the magnitude of the fixed DC bias voltage is selected so that if a carrier is within ±1 MHz when discriminator 66 is coupled to low pass filter 40, the output voltage of discriminator 66 will be dominant over it and local oscillator 26 will be controlled so that deviation between the frequency of the carrier found and 45.75 MHz is minimized. The lower limit of the magnitude of the fixed DC bias voltage is selected to determine the rate at which the frequency of local oscillator 26 is swept.

As was previously described, when a new channel is selected, channel selection unit 60 generates a CHANGE binary signal which is coupled to mode control unit 72 and step control unit 76. In response to the CHANGE signal, the logic circuits of step control unit 76 which generate the binary signals which in turn control the incrementing and decrementing of N are reset so that N is at its nominal value for the selected channel. Furthermore, in response to the CHANGE signal, mode control unit 72 resets the inhibition of the ADVST signal and initiates phase locked loop control so that the nominal local oscillator frequency for the selected channel may be synthesized as previously described.

If a viewer selects an improper or "illegal" channel, such as, for example, in the United States channels 00, 01 or channels above 83, band decoder 50 does not generate either a $V_L$ signal (channels 2–6), a $V_H$ signal (channels 7–13), a U signal (channels 14–83). As a result, none of the varactors comprising local oscillator 26 will be energized and local oscillator 26 will not produce a local oscillator signal. As will subsequently be described, band decoder 50 must be occasionally cycled in order to properly decode the band of a selected channel. Therefore, to ensure that band decoder 50 is occasionally cycled so that it will properly function to select the band when a legal channel is selected, an ILLEGAL binary signal is generated by band decoder 50 and coupled to divide N input switch 42 when a viewer has selected an illegal channel. In response to the ILLEGAL signal divide by N input switch 42 decouples the output of divide by K prescaler 28 from the input of dual modulus divider 44 of divide by N unit 30 and couples a signal having a predetermined frequency (e.g., 2 MHz) to dual modulus divider 44 instead so that band decoder 50 is occassionally cycled.

The ILLEGAL signal is also coupled to mode switch 64 so that the pulses generated by phase comparator 34 are not coupled to low pass filter 40 to prevent an erroneous tuning voltage from being applied to local oscillator 26 from low pass filter 40 when an illegal channel has been selected by a viewer.

Furthermore, since television distribution systems do not in general produce frequency translations for UHF carriers, band decoder 50 couples a V binary signal to mode control unit 72 so that discriminator control is provided only when a VHF channel has been selected. It is noted that the tuning system of FIG. 1 may be modified to have nonstandard frequency RF carriers in the UHF range.

Figure 2:
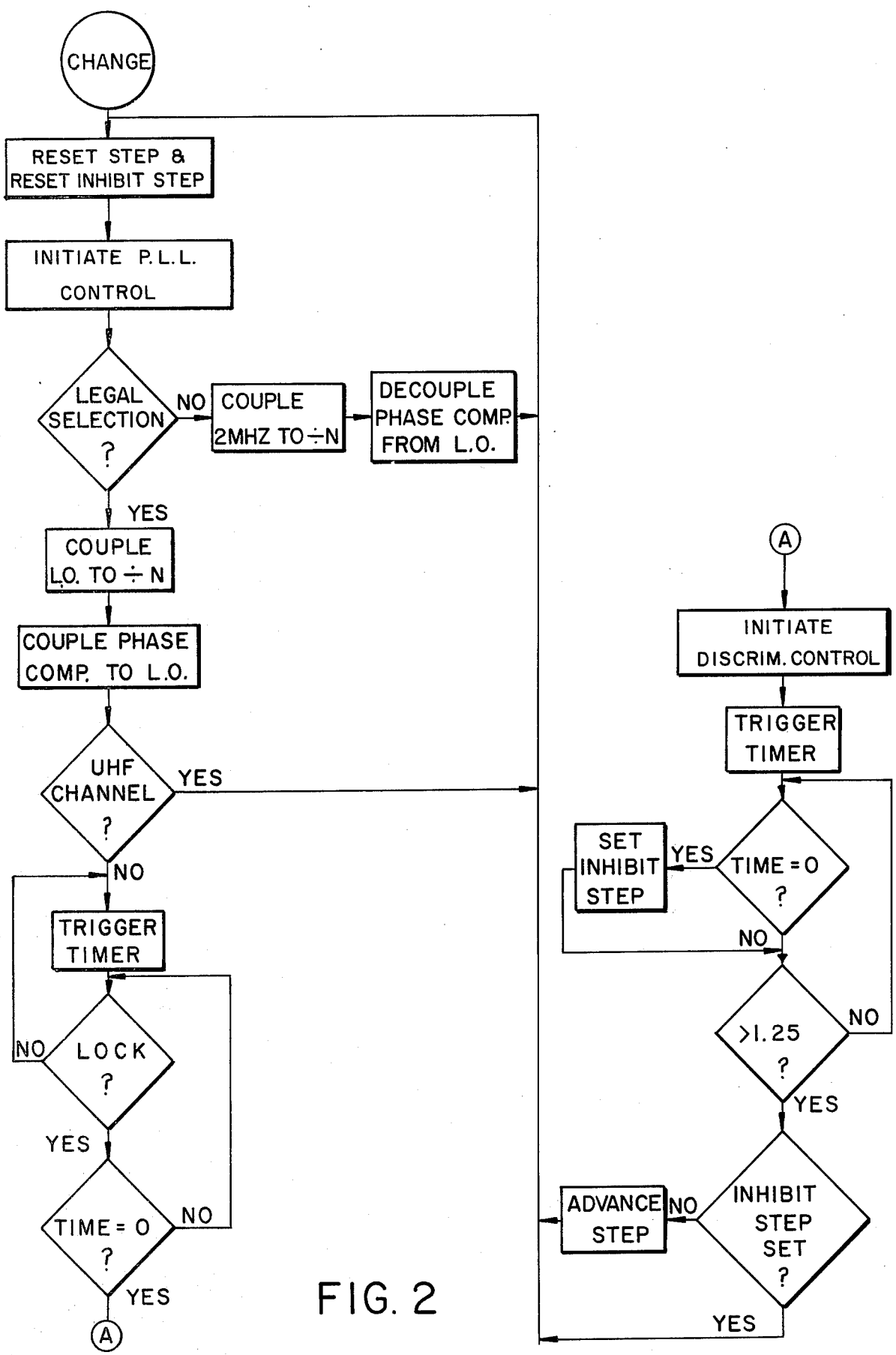
FIG. 2 shows a flow chart indicating the tuning algorithm followed by the tuning system of FIG. 1.

The above described tuning sequence or algorithm is graphically represented by the flow chart of FIG. 2. It is noted that the portion of the flow chart concerning the LOCK? decision block has not yet been described. Furthermore, the interactions of certain portions of the tuning system of FIG. 1 have not yet been described. These features are described with reference to FIGS. 3–7, which are schematic diagrams showing logic implementations of various portions of the tuning system of FIG. 1, and FIG. 8, which is a block diagram showing the detailed interconnections of the logic implementations shown in FIGS. 3–7. The implementations of FIGS. 3–7 utilize commercially available components as indicated. However, it will be appreciated that a major portion of the tuning system of FIG. 1 may be formed as an integrated circuit.

Figure 3:
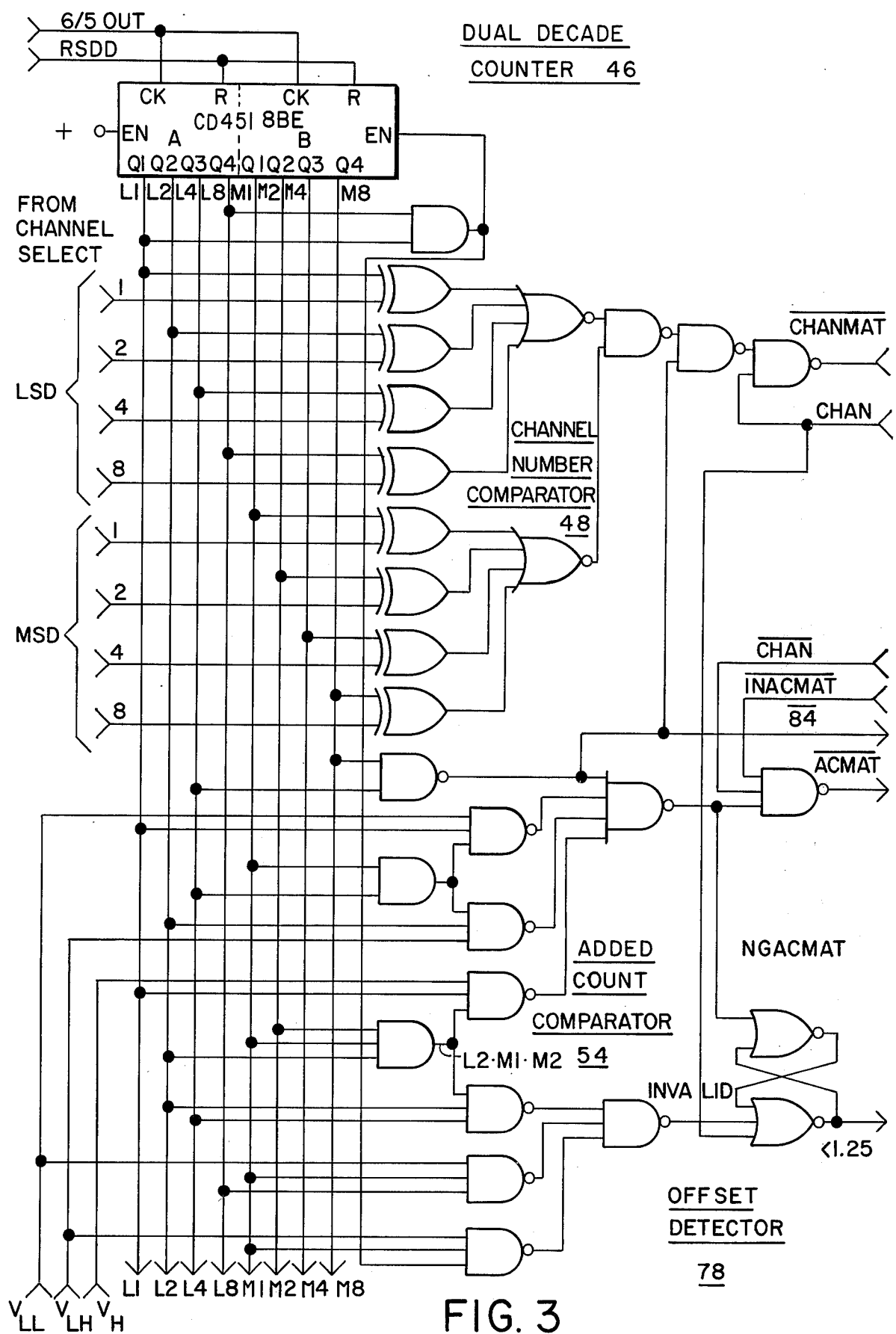
FIGS. 3–7 show logic implementations of various portions of the tuning system shown in FIG. 1.
Figure 4:
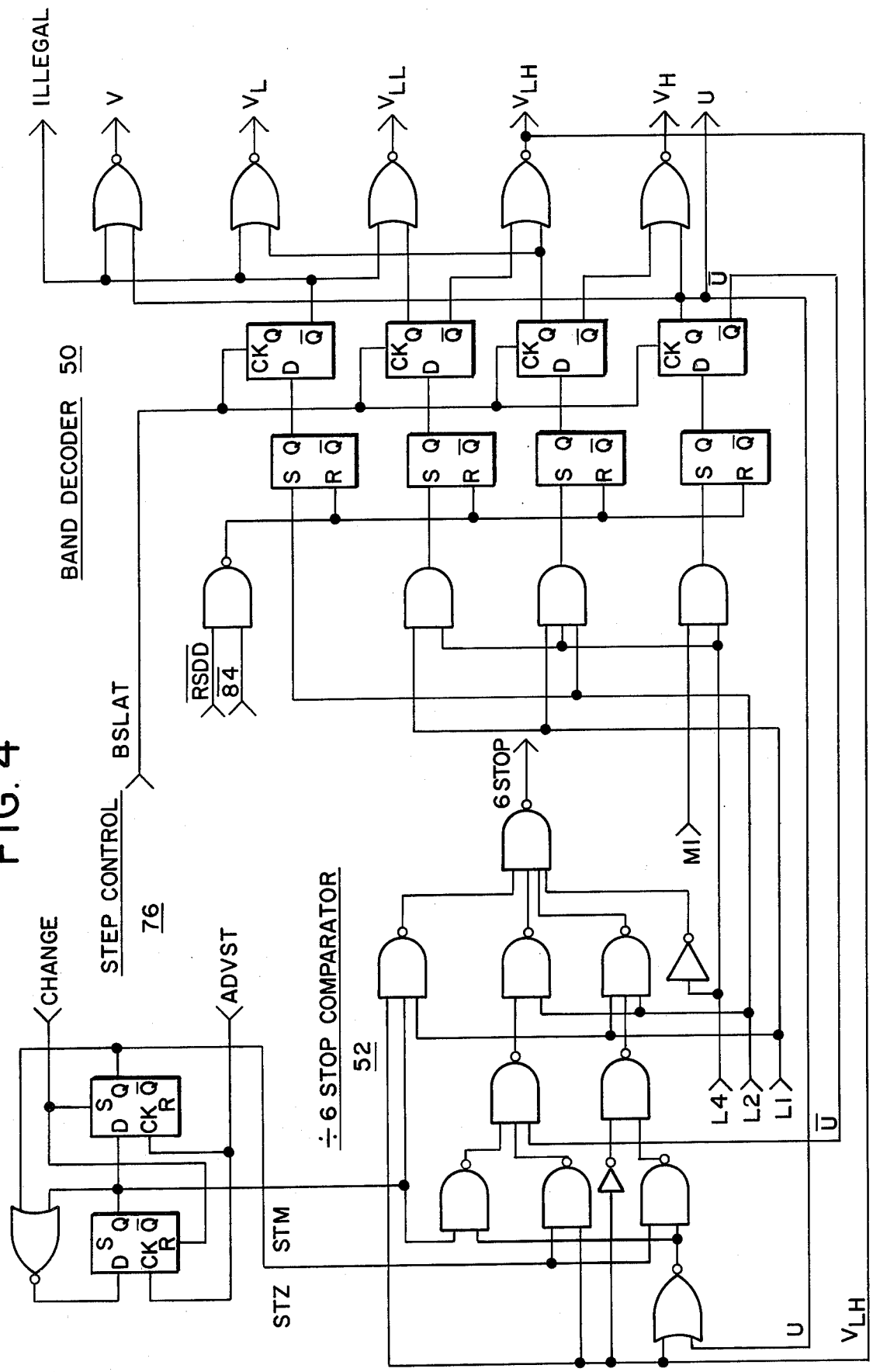
Figure 5:
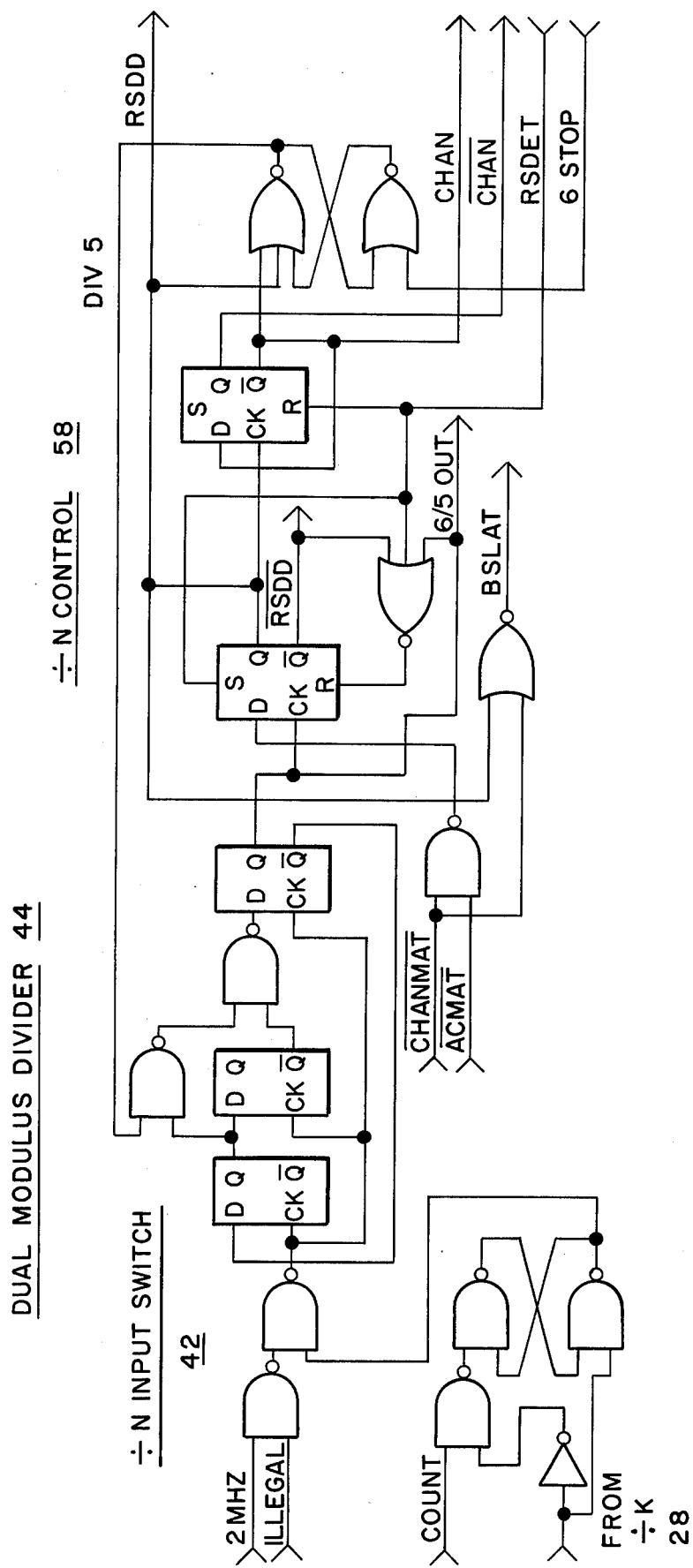

Logic implementations of dual modulus divider 44, dual decade counter 46, channel number comparator 48, divide by 6 stop comparator 52, added count comparator 54 and divide by N control unit 58 comprising divide by N unit 30 are shown in FIGS. 3–5. Also shown in FIGS. 3–5 are logic implementations of band decoder 50, offset detector 78, step control unit 76, which are integrally interconnected with the units comprising divide by N unit 30, and divide by N input switch 42.

An understanding of the operation of the divide by N function of divide by N unit 30 is facilitated by an understanding of the frequency relationships of the signals associated with the various channels a viewer may select. In the United States, for example, in the RF range, the channels are 6 MHz wide and lie between 54 and 890 MHz in four separated bands: a band ($V_{LL}$) including channels 2–4, a band ($V_{LH}$) including channels 5 and 6, a band ($V_H$) including channels 7–13 and a band (U) including channels 14–83. Within each band, the channels are contiguous. The local oscillator frequencies are 45.75 MHz above the corresponding picture carrier frequencies in the RF range in a range between 101 and 931 MHz and also reside in four separated bands corresponding to the four bands in the RF range. In each local oscillator band, there is a 6 MHz spacing between the local oscillator frequencies. The local oscillator frequencies in megahertz are odd integers. One (1) MHz is the greatest common divisor of all the local oscillator frequencies.

Divide by N unit 30 divides the frequency of the output signal of divide by K prescaler 28 by N, where the factor N is the local oscillator frequency in MHz for the selected channel, by counting N periods of the output signal of divide by K prescaler 28. The divide by N counting cycle is composed of two parts: a first portion related to the number of selected channel and a second portion related to the frequency band in which the selected channel resides. During the first portion, dual modulus divider 44 generates one output pulse (i.e., counts once) for every 6 input pulses from prescaler 28 (i.e., divides by 6) and dual decade counter 46 counts until the channel number is reached. During the second portion dual modulus divider 44 initially counts by 6 and is later caused to count by 5 while the dual decade counter 46 counts until an added count number is reached. For the second portion, the number of "6's" and "5's" counted and the added count number are related to the frequency band in which the selected channel resides. Thus, there are four sets of numbers corresponding to the four bands. The divide by N counting cycle is represented by the expressions:

$$N = [\text{1st portion}] + [\text{2nd portion}] \quad (2)$$

$$N = [6 \text{ No.}] + [6B + 5(A-B)] \quad (3)$$

where,
N is the integer number of MHz of the local oscillator frequency
No. is the channel number
A is the added count
B is the number of 6's counted during the second portion
A−B is the number of 5's counted during the second portion Dual decade counter 46 is reset at the end of each portion and thus is reset twice per divide by N cycle. It is not reset when the modulus of the dual modulus divider 44 is changed from 6 to 5 during the second portion of the divide by N cycle. Resetting the dual decade counter takes an extra cycle of the output signal of dual modulus divider 44 so that, in fact, the equation (3) for the logic implementation of FIGS. 3–5 is:

$$N = [6 \text{ No.}+6] + [6(B-1) + 5(A-B-1) + 5] \quad (4)$$

Table 1 below shows the values of the various variables of equation (4) for the four bands $V_{LL}$, $V_{LH}$, $V_H$ and U.

TABLE 1

Number Chart for Divide by N Algorithm

| | No. | A | B | A-2 | B-1 |
|---|---|---|---|---|---|
| $V_{LL}$ | 2–4 | 17 | 4 | 15 | 3 |
| $V_{LH}$ | 5,6 | 18 | 3 | 16 | 2 |
| $V_H$ | 7–13 | 35 | 4 | 33 | 3 |
| U | 14–83 | 86 | 3 | 84 | 2 |

Figure 8:
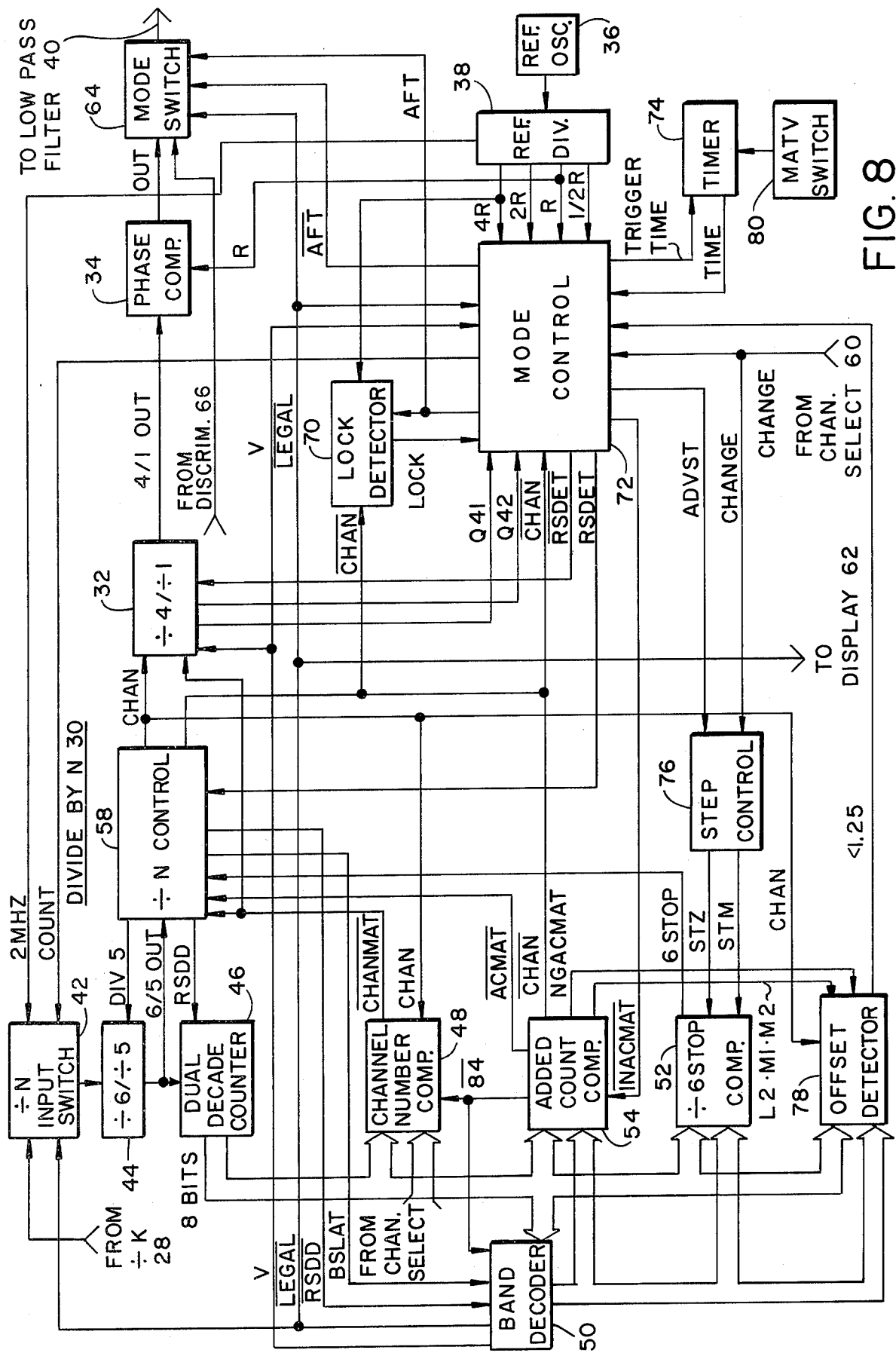
FIG. 8 shows a block diagram indicating the interconnections of the various logic implementations shown in FIGS. 3–7.
Figure 9:
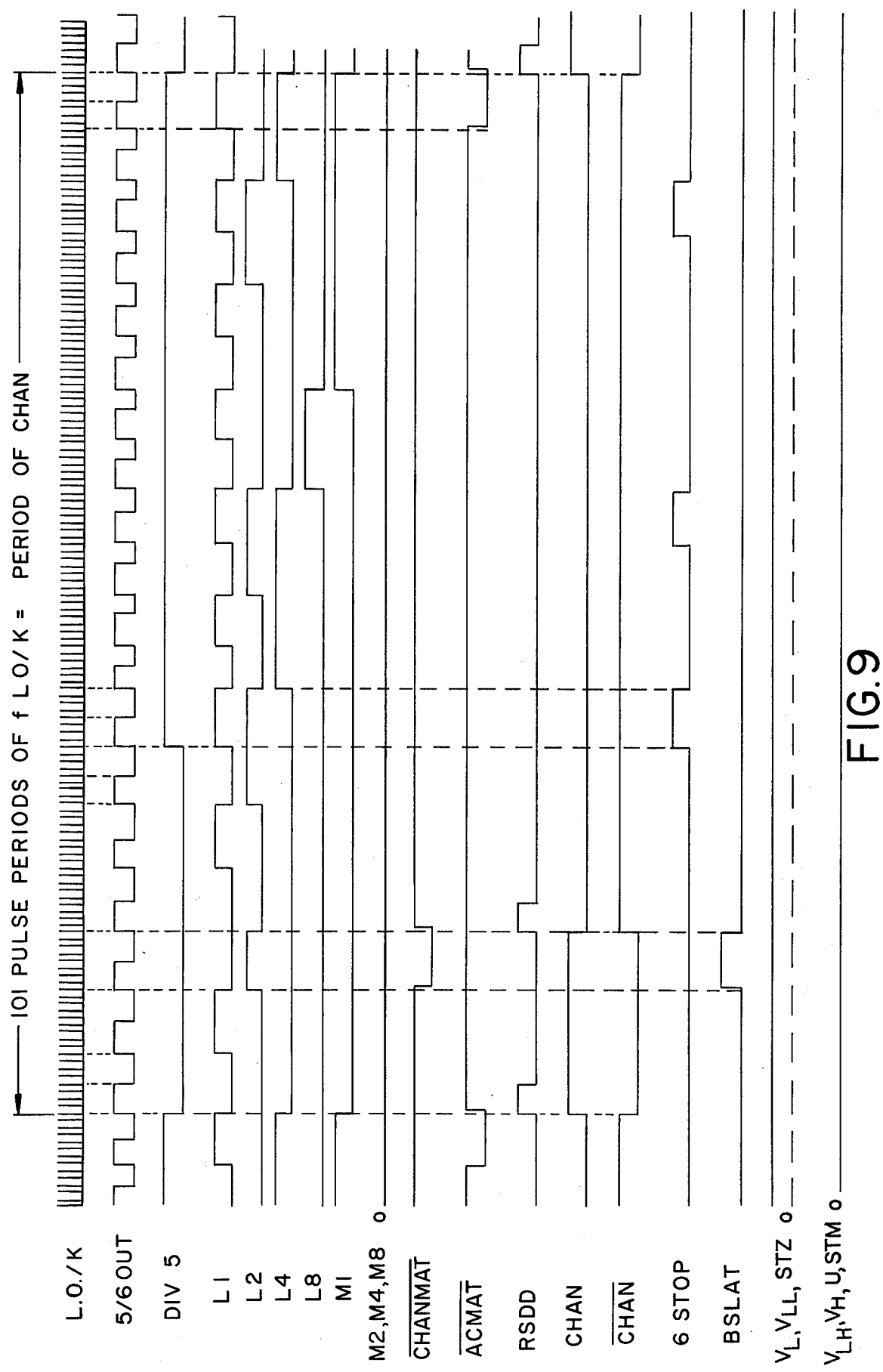
FIGS. 9–12 show graphical representations of timing diagrams associated with the logic implementations shown in FIGS. 3–7.

The divide by N operation of divide by N unit 30 shown in block diagram form in FIG. 8 can best be illustrated by way of an example in which the selected channel is 2. Concurrent reference should be made to the FIG. 9 which shows the time relationships between various signals associated with divide by N circuit 30 when it is dividing the frequency of the input signal from prescaler 28 by the number N, i.e., 101, corresponding to channel 2. Just prior to the start of the channel number (first) portion of the divide by N cycle, a positive-going pulse, RSDD (Reset Dual Decade), is generated by divide by N control unit 58 to reset dual decade counter 46. Simultaneously divide by N control unit 58 causes a DIV5 (Divide by 5) signal to go low (a logic 0) which causes dual modulus divider 44 to thereafter divide by 6.

On each positive-going transition of the output signal of dual modulus divider 44, dual decade counter 46 is incremented by 1. When the BCD output of dual decade counter 46, 4 bits (L1 – L8) for the least significant digit and 4 bits (M1 – M8) for the most significant digit, reach a count corresponding to 02, a match occurs with the BCD signals provided by channel selection unit 60. In response, channel number comparator 48 causes a signal $\overline{\text{CHANMAT}}$ (Chan Match) to go low. At the next positive-going transition of the output signal of dual modulus divider 44, a positive-going RSDD pulse resets dual decade counter 46. The RSDD pulses causes the channel number (first) portion to last one extra cycle. During the duration of the channel (first) portion of the divide by N cycle, divide by N control unit 58 generates a positive going CHAN pulse which is coupled to divide by 4/divide by 1 divider 32 as the output of divide by N unit 30.

At this point, the added count (second) portion of the divide by N cycle is initiated and dual decade counter 46 once again starts to count up from 00. However, the DIV5 signal is still low and dual modulus divider 44 continues to divide by 6. When the count of dual decade counter 46 reaches 03 (B−1 in Table 1), divide by 6 stop logic unit 52 detects a match and causes a 6 STOP signal to go high (a logic 1). In response, divide by N control unit 58 causes the signal DIV5 to go high and dual modulus divider 44 is thereby caused to thereafter divide by 5. However, dual decade counter 46 is not reset and continues counting. When the count reaches 15 (A-2 in Table 1), added count comparator 54 detects a match and causes an $\overline{\text{ACMAT}}$ (Added Count MATch) signal to go low. At the next reset positive-going transition of the output signal of dual modulus divider 44, divide by N control unit 58 generates a positive-going RSDD pulse which resets dual decade counter 46 and causes the signal DIV5 to go low. As a result, dual decade counter 46 is reset and dual modulus divider 44 is caused to thereafter divide by 6. The divide by N cycle is now complete.

A divide by N unit similar to divide by N unit 30 of FIG. 1 in which a dual modulus divider selectively divides by 6 or 7 rather than by 6 or 5 is described in U.S. Patent application Ser. No. 662,097, filed for R. M. Rast on Feb. 27, 1976, and assigned to the same assignee as the present invention, which is hereby incorporated by reference.

Turning now to the detailed logic implementations of divide by N unit 30 shown in FIGS. 3–5, it is seen in FIG. 5 that dual modulus divider 44 comprises first and second cascaded D-type flip-flops and a third D-type flip-flop whose input is selectively coupled to the $\overline{Q}$ output of the second D-type through a NAND gate network. When the DIV5 signal, coupled to the NAND gate network, is high, dual modulus divider 44 divides by 5. When the DIV5 signal is low, dual modulus divider 44 divides by 6.

In FIG. 3, it is seen that dual decade counter 46 comprises a two-decimal-digit synchronous counter such as, for example, the CD4518BE COS-MOS (complimentary symmetry metal oxide semiconductor) type counter available from RCA Corporation. The count of dual decade counter 46 is incremented on positive transitions of the output signal of dual modulus counter 44. Positive-going RSDD pulses from divide by N control unit 58 cause the counter to be reset. As earlier described, the output signals of dual decade counter 46 include a first group of 4 BCD (L1–L8) signals for the lowest significant digit and a second group of 4 BCD signals (M1–M8) for the most significant digit. It should be noted that the most significant digit portion of dual decade counter 46 need only be a binary counter (rather than decimal) since the highest count is 84.

In FIG. 3 it is seen that channel number comparator 48 receives 8 bits from channel selection unit 60 and 8 bits from dual decade counter 46. When the signal CHAN generated by divide by N control unit 58 goes high (i.e., during the channel portion of the divide by N cycle) in response to a match between respective pairs of bits, channel number comparator 48 causes $\overline{CHAN\text{-}MAT}$ signal to go low. As the highest channel number is 83, if a count 84 is reached, a signal $\overline{84}$, generated by added count comparator 54, causes the signal $\overline{CHAN\text{-}MAT}$ to go low.

In FIG. 3 it is seen that the 8 bits from dual decade counter 46 are also coupled to added count comparator 54. Furthermore, band signals $V_{LL}$ (channels 2–4), $V_{LH}$ (channels 5–6) and $V_H$ (channels 7–13) generated by band decoder 50 in a manner to be described are coupled to added count comparator 54. When a match occurs, the signal $\overline{ACMAT}$ generated by added count comparator 54 goes low. The values (A−2) for which a match occurs in each band are shown in Table 1 above. If a match has not occurred before a count of 84 has been reached, added count comparator 54 causes $\overline{ACMAT}$ to go low. The signal $\overline{ACMAT}$ is inhibited from going low unless both $\overline{CHAN}$, generated by divide by N control unit 58, in INACMAT, generated by mode control unit 72, in a manner to be described, are both high. In this manner the output of added count comparator 54 is inhibited except during the second portion of the divide by N cycle. The signal $\overline{INACMAT}$ is utilized when discriminator 66 is controlling local oscillator 26 in evaluating how far the local oscillator frequency has drifted from the value synthesized under phase locked loop control. Added count comparator 54 also generates a signal NGACMAT (Not Gated Added Count MATch) which is coupled to the offset detector 78. The signal NGACMAT goes high whenever an added count match occurs regardless of the states of the $\overline{CHAN}$ and $\overline{INACMAT}$ signals. The signal NGACMAT is also utilized in the evaluation of how far the frequency of local oscillator 26 has drifted from the value synthesized under phase locked loop control. Furthermore, the signal 84, coupled to the channel number comparator 48 and band decoder 50, is generated by added count comparator 54. Added comparator 54 also "ands" the signals L2, M1 and M2 to form a signal L2.M1.M2 representing a count of 32 which is coupled to offset detector 78.

In FIG. 4 it is seen that 3 least significant bits (L1–L4) of the 8 bits from dual decade counter 46, the band signals $V_{LH}$ (channels 5–6), U (channels 14–83) and $\overline{U}$ from band decoder 50 and the signals STZ (STep Zero) and STM (STep Minus) from step control unit 76 are coupled to divide by 6 stop comparator 52. The states of the signals STZ and STM for the three step conditions described before are given in Table 2 below.

TABLE 2

|     | O | + 1 MHz | − 1 MHz |
|-----|---|---------|---------|
| STZ | 1 | 0       | 0       |
| STM | 0 | 0       | 1       |

The count (B−1) of dual decade counter 46 at which divide by 6 stop comparator 52 causes the 6 STOP to go high depends on the band in which the selected channel resides and the states of STZ and STM, i.e., the step condition given in Table 2 above. The values of B−1 at which a match occurs for the various bands and step conditions is given in Table 3 below.

TABLE 3

| | Values of B-1 for the Three Frequency Steps Deviation of $f_{LO}$ from Nominal | | |
|---|---|---|---|
| | O | + 1 MHz | − 1 MHz |
| $V_{LL}$ | 3 | 4 | 2 |
| $V_{LH}$ | 2 | 3 | 1 |
| $V_H$ | 3 | 4 | 2 |

Thus, by controlling the value of B−1, the duration of the divide by N cycle may be incremented and decremented. Correspondingly, from an examination of expression (4), it may be seen by controlling the value of B−1 in accordance with Table 3, the frequency of local oscillator 26 may be incremented and decremented by 1 MHz.

Since only three bits of the 8 bits provided by dual decade counter 46 are utilized by divide by 6 stop comparator, it is conceivable that the signal 6 STOP can go high several times during the divide by N cycle. However, divide by N control unit 58 ignores the 6 STOP signal during the channel number (CHAN) portion and only the first occurrence is important during the added count ($\overline{CHAN}$) portion.

Band decoder 50 shown in FIG. 4 utilized the 8 bits representing the accumulated count of dual decade counter 46 and a sequential logic arrangement to decode the band in which the selected channel resides. A similar arrangement is described in the aforementioned U.S. Patent application Ser. No. 662,097. The band information is refreshed once per divide by N cycle during the channel number (CHAN) portion. Four set-reset (S-R) flip-flops, one for each of the bands, are reset in response to a negative going $\overline{RSDD}$ pulse from divide by N control unit 58 just prior to the beginning of the channel number portion of the divide by N cycle. Each S-R flip-flop is assigned to a different band and each is set when the count reaches the lowest channel in the respective band, i.e., 2 for $V_{LL}$, 5 for $V_{LH}$, 7 for $V_H$ and 14 for U. If the requested channel is 0 or 1, no S-R flip-flop is set. If the requested channel is higher than 83 all S-R flip-flops are reset when the count reaches 84 in response to the signal 84 from the added count comparator 54 going low. When a match occurs in channel number comparator 48, a signal BSLAT (Band Select LATch) generated by divide by N control unit 58 goes high causing the states of the S-R flip-flops to be preserved in D-type flip-flops whose inputs are respectively coupled to the set (Q) outputs of the S-R flip-flops. Combinational logic derives the band information from the states of the D-type flip-flops. The band in which the selected channel resides is the highest band for which a respective D-type flip-flop is set. If no D type flip-flop is set because an illegal channel has been requested, band decoder 50 causes a signal ILLEGAL to go high.

Band decoder 50 also couples a $V_L$ (channels 2-6), a $V_H$ (channels 7-13) and a U (channels 14-83) to local oscillator 26 to control its frequency range as was previously described. Furthermore, a high ILLEGAL signal causes divide by N input switch 42 to couple the 2 MHz signal from reference divider 38 to dual modulus divider 44 when the selected channel is illegal. This ensures that the band decoder 50 is kept operating during a time when the signals $V_L$, $V_H$ and U are low and as a result local oscillator 26 is not providing an output signal as was previously described.

Figure 6:
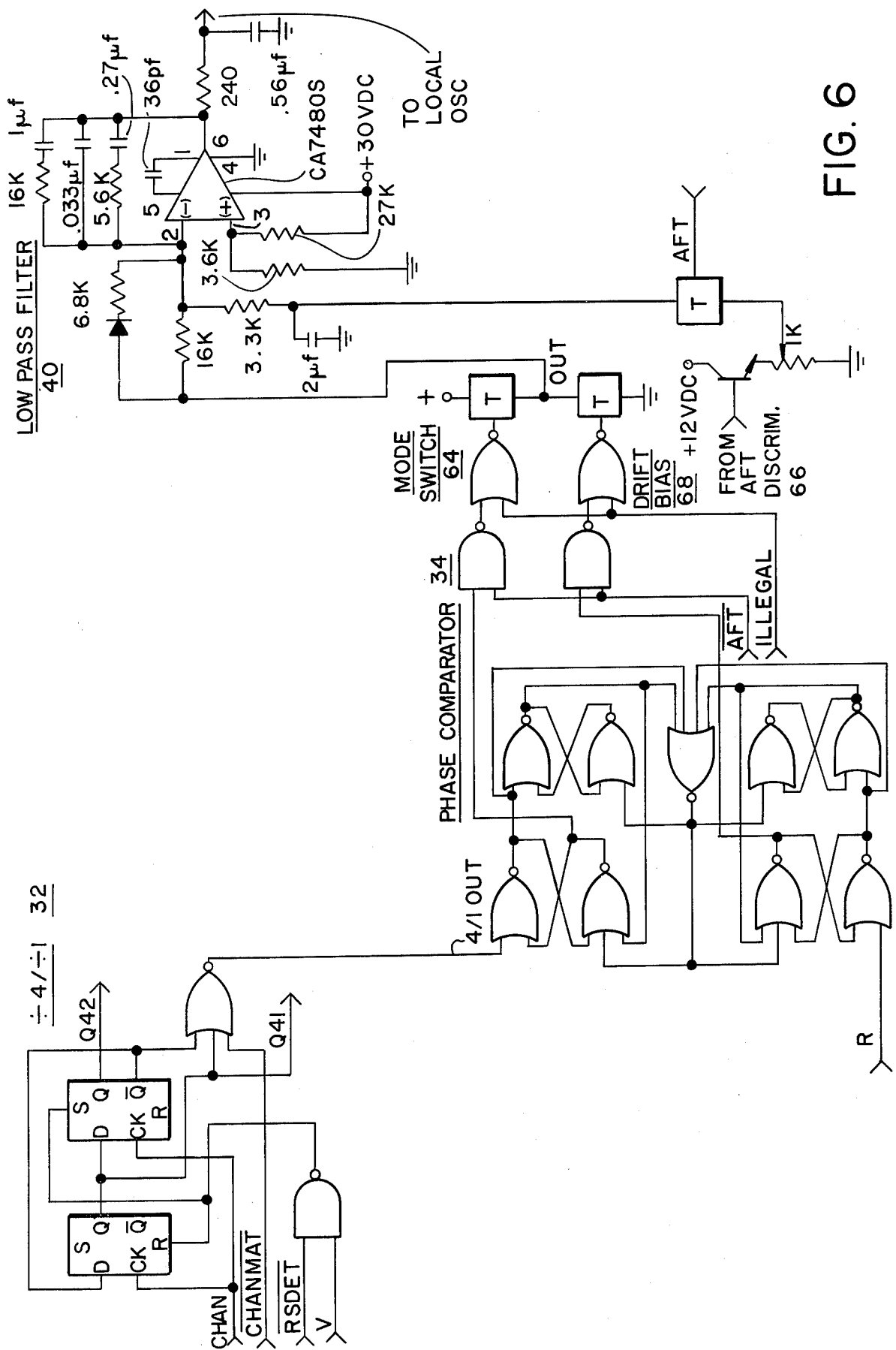

The logic implementation of divide by 4/divide by 1 divider 32 shown in FIG. 6 receives the signals CHAN from divide by N control unit 58, the signal V (indicating that a VHF channel has been selected) from band decoder 50, and the signal $\overline{\text{CHANMAT}}$ from channel number comparator 48. The signal CHAN is used as the clock for the two programmable D-type flip-flops comprising divider 32. When the signal V is high, divider 32 divides by 4. When the signal V is low, divider 32, divides by 1. The factor of 4 is inserted for VHF channels to compensate for the factor of 4 difference between the value of K of prescaler 28 for UHF channels (e.g., 256) and the value of K for VHF channels (e.g., 64) to allow the source reference frequency, $f_{REF}$, e.g., 3.90625 KHz to be utilized for both the VHF and UHF ranges. This equality in reference frequency is desirable since it eases the stability requirements on low pass filter 40.

The output signal of divider 32, 4/1OUT, is coupled to phase comparator 34 during the duration of the $\overline{\text{CHANMAT}}$ signal. The signal $\overline{\text{RSDET}}$ (the logic complement of ReSet DETector), coupled to divider 32, goes low to reset the flip-flops comprising divider 32 during the offset evaluation sequence as will be subsequently described. Furthermore, the output signals $Q_{41}$ and $Q_{42}$ of the flip-flops comprising divider 32, coupled to mode control unit 72 are utilized for the offset evaluation. The time relationship between the signals CHAN, $Q_{41}$, $Q_{42}$ and 4/1OUT are graphically illustrated in FIG. 10.

Figure 7:
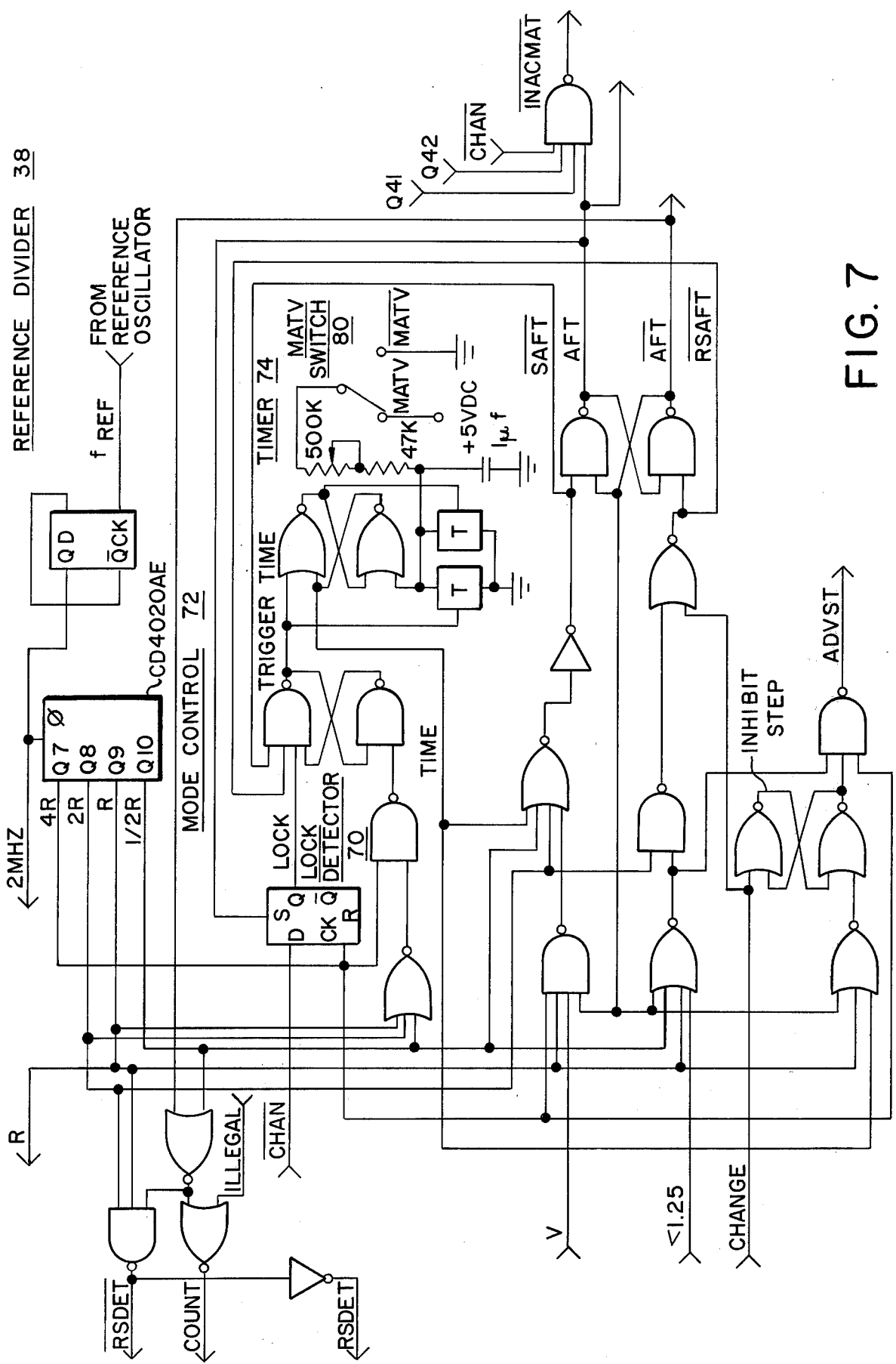

The logic implementation of reference divider 28 shown in FIG. 7 includes a D-type flip-flop to derive a 2 MHz signal from the 4 MHz signal coupled to it from reference oscillator 36. The 2 MHz signal is coupled to divide by N input switch 42 and also to a 10 stage binary ripple counter, comprising for example a CD4020AE COS-MOS type counter available from RCA Corporation. The binary ripple counter generates the reference frequency signal R (3.90625 KHz), its binary multiples 2R and 4R and its binary submultiple R/2. The signals R, 2R, 4R and R/2 are timing signals for mode control unit 72. The signal 4R is also coupled to lock detector 70. The time relationships between the signals R, 2R and 4R are graphically illustrated in FIG. 10.

The logic implementation of phase comparator 34 in FIG. 6 is similar to that of the phase comparator II in the CD4046 COS-MOS integrated circuit available from RCA Corporation. The input signals are the 4/1OUT signal from the divide by 4/divide by 1 divider 32 and the R signal from reference divider 38. Its output signal is coupled to active low pass filter 40. Phase comparator 34 comprises two edge-triggered memory networks each comprising two cascaded cross coupled type of flip-flops. The outputs of the second flip-flops of the memory networks are respectively coupled to two transfer (T) gates shown as being included in mode switch 64. The two transfer gates are connected in cascode between a source of positive supply voltage and ground and their common junction forms a summing point at which the output signal OUT of phase comparator 34 is developed.

In response to the phase difference between the two input signals, the two transfer gates are selectively turned on and off and the filter capacitors of low pass filter 40 are correspondingly charged and discharged. The polarity of the output pulse of phase comparator 34 depends on which input signal provides the first positive-going transition and represents the polarity of the phase error between the two input signals. The pulse width of the output pulse is determined by the time delay between the positive-going transitions of the two input signals and represents the magnitude of the phase error between the two input signals. When the two input signals are substantially in phase, the two transfer gates are both turned off and the filter capacitor of low pass filter 40 is neither charged or discharged by any appreciable amount. The time relationships between the signals 4/1OUT, R and OUT when the phase locked loop approaches a locked condition are graphically illustrated in FIG. 10.

An implementation of mode switch 64 is shown in FIG. 6. Two gating networks, each comprising a NAND gate and a NOR gate connected in cascade, are respectively coupled between the two edge-triggered memory circuits comprising phase comparator 34 and the two previously described transfer gates included as part of mode switch 64. An $\overline{\text{AFT}}$ signal is coupled to the NAND gates from mode control 72 and the ILLEGAL signal is coupled to the NOR gates from band decoder 50. When the $\overline{\text{AFT}}$ signal goes low during the discriminator control mode, the outputs of the two edge-triggered memory circuits of phase comparator 34 are decoupled from low pass filter 40 by virtue of the two NAND gates. Similarly, when the ILLEGAL signal goes high because an illegal channel has been selected, phase comparator 34 is decoupled from low pass filter 40 by virtue of the two NOR gates. As previously stated, it is desirable to decouple phase comparator 34 from low pass filter 40 when an illegal channel has been selected so that the varactor tuning voltage of local oscillator 26 is maintained. Otherwise, the loop lockup time could be increased because the correction pulses applied to low pass filter 40 when an illegal channel has been selected could drive the tuning voltage away from the correct voltage required when a legal channel is ultimately selected.

Another part of mode switch 64 includes an NPN transistor configured as an emitter follower. The error voltage developed by discriminator 66 is coupled to the base of the transistor. A portion of the AFT error voltage is selectively coupled via a transfer gate (T) to the inverting input of an operational amplifier such as, for example, a CA7480S integrated circuit available from RCA Corporation, included in low pass filter 40.

AFT discriminator 66 has an S-shaped voltage versus frequency transfer characteristic with the voltage, for example, varying between 0 and +12 volts and a nominal output voltage of, for example, 6 volts for a no-signal condition. A one Kiloohm potentiometer connected to the emitter of the NPN transistor serves two functions. Firstly, it attenuates the AFT error voltage such that the no-signal discriminator error voltage is substantially equal to the bias voltage applied to the non-inverting input of the op amp in low pass filter 40, and thus causes the operational amplifier inputs to be substantially DC balanced. Secondly, it serves as the implementation of drift bias 68 since adjusting the pot to slightly unbalance the operational amplifier inputs introduces a DC bias in the discriminator error voltage. When the AFT signal from mode control unit 72 goes high, a portion of the discriminator error signal is coupled to low pass filter 40. The bias voltage is integrated by low pass filter 40 to cause the frequency of local oscillator 26 to be swept in a predetermined direction.

Lock detector 70 as shown in FIG. 7 is a programmable D-type flip-flop having the signal 4R derived by reference divider 38 coupled to its clock (CK) input and the signal $\overline{\text{CHAN}}$, derived by divide by N control unit 58, coupled to its data (D) input. On positive-going transitions of the signal 4R, the signal $\overline{\text{CHAN}}$ is sampled. If the loop is locked, the signal $\overline{\text{CHAN}}$ will be high. As a result, the signal LOCK developed at the Q output of the D-type flip-flop will go high. If the loop is unlocked, samples will occur when the signal $\overline{\text{CHAN}}$ is low with the result that the signal LOCK will go low. Furthermore, the signal AFT from mode control unit 72 is coupled to the set (S) input of the D-type flip-flop to hold the LOCK signal high when the tuning system is under discriminator control.

As is indicated in the tuning algorithm shown in FIG. 2, and as will be explained further with reference to the logic implementation of mode control unit 72 also shown in FIG. 7, the LOCK signal is in essence integrated using a retriggerable one-shop multivibrator comprising a cross-coupled set-reset flip-flop and a resistor-capacitor network, included in timer 74. When phase locked loop is first initiated, the one-shot multivibrator is triggered. Further, whenever the LOCK signal goes low, indicating that the phase locked loop is not locked, the one-shot multivibrator is retriggered. When the phase locked loop achieves lock, the LOCK signal will remain high and thus will no longer cause the one-shot to be retriggered. However, discriminator control is not initiated by mode control unit 72 until the one-shot multivibrator resets itself.

To evaluate the offset between the local oscillator frequency during the interval in which local oscillator 26 is under discriminator control and the local oscillator frequency synthesized under phase locked loop control, offset detector 78 is used in conjunction with mode control unit 72, divide by 4/divide by 1 divider 32 and the portions of divide by N unit 30 utilized to divide the frequency of the output signal of prescaler 28 by N previously described. This arrangement is advantageous since it makes use of a major portion of the logic circuitry already available for other functions of the tuning system. In essence, when local oscillator 26 is under discriminator control, divide by N unit 30 is used as a frequency counter to evaluate the frequency offset between the local oscillator frequency and its originally synthesized value.

As was previously stated, 1.25 MHz is chosen as the offset threshold because it is a frequency offset readily counted by divide by N unit 30 and allows for some overshoot beyond the desired control range of discriminator 66 (e.g., ±1 MHz) while limiting discriminator control within a range excluding undesired carriers such as the lower adjacent channel sound carrier which is, e.g., 1.5 MHz above the picture carrier (in the IF frequency range).

Figure 11:
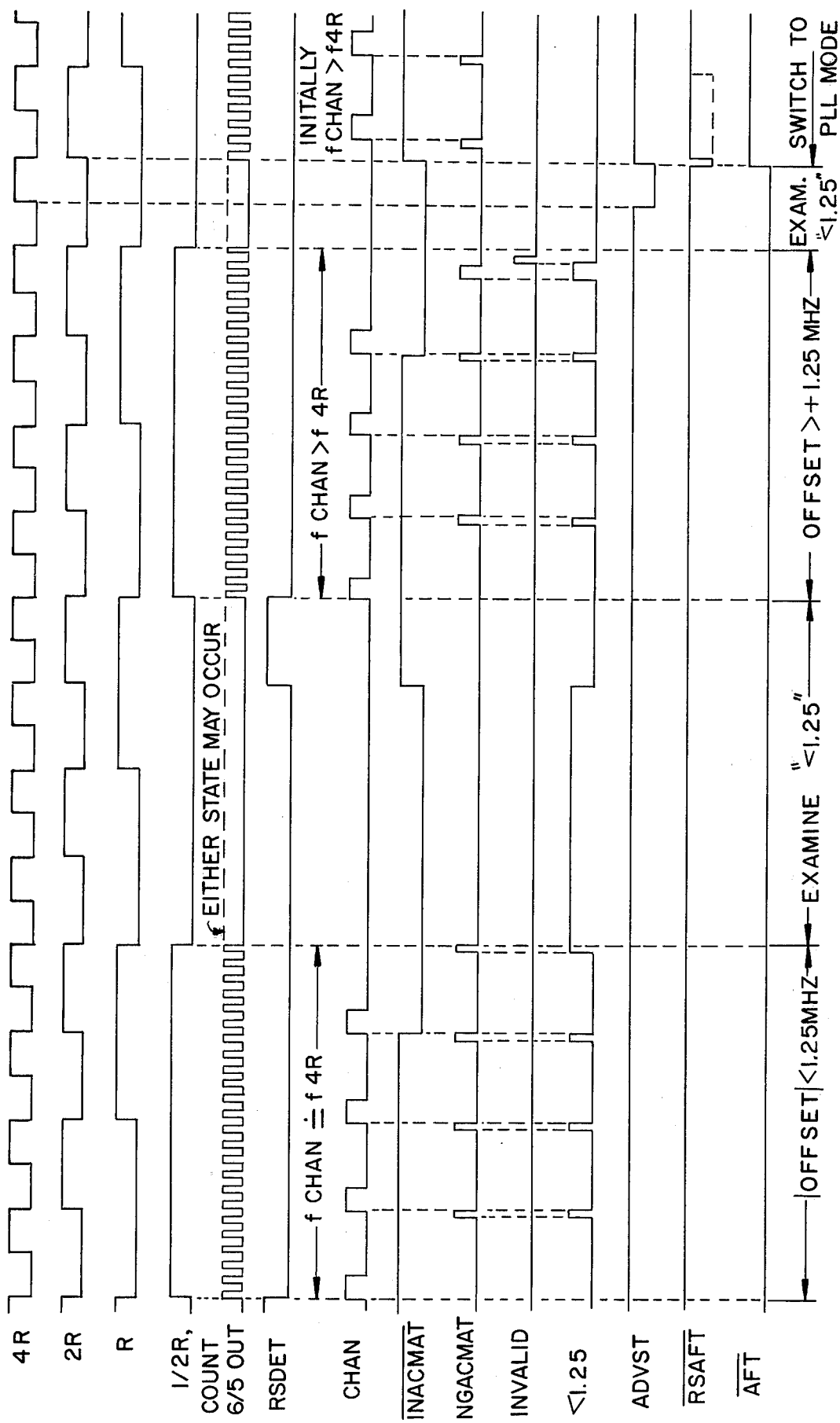

With reference to FIG. 11, which shows the time relationships between various signals associated with the offset evaluation, when local oscillator 26 is under locked phase locked loop control, for each cycle of the frequency reference signal R, the divide by N cycle ($\overline{\text{CHAN}}$) repeats four times, when VHF channels are being tuned. This is mathematically expressed in equation (1). By combining expressions (1) and (4) and substituting the values 64 for K, 4 for M, and $f_R$ for $f_{REF}/R$ (where $f_R$ is the frequency of the output signal of reference divider 38), the frequency, $f_{LO}$, of the local oscillator under locked phase locked loop control (for VHF channels) is $$f_{LO} = 64 \times \{[6 \text{ No.} + 6] + [6(B-1) + 5(A-B-1) + 5]\} \times 4 \times f_R \qquad (5)$$

With reference to expression (5), it may be seen that if during the last (i.e., fourth) divide by N cycle occurring in one cycle of the signal R, one less 5 were counted, the synthesized local oscillator frequency would be changed by −1.25 MHz. Similarly, if one extra 5 were counted, the synthesized local oscillator frequency would be changed by +1.25 MHz. Thus, if during the tuning operation in which local oscillator 26 is under discriminator control, the divide by N cycle were initially synchronized with the cycle of the signal R, and if the number of 5 counts during the added count portion were evaluated during the last divide by N cycle in the reference interval, the frequency offset from the synthesized local oscillator frequency could be determined. Furthermore, it is noted that although the length of the added count portion depends on the band in which the selected channel resides, it does not depend on the selected channel. This, as will be seen, simplifies the logic implementation of offset detector 78 which evaluates the number of 5 counts during the added count portion when local oscillator 26 is under discriminator control.

Figure 10:
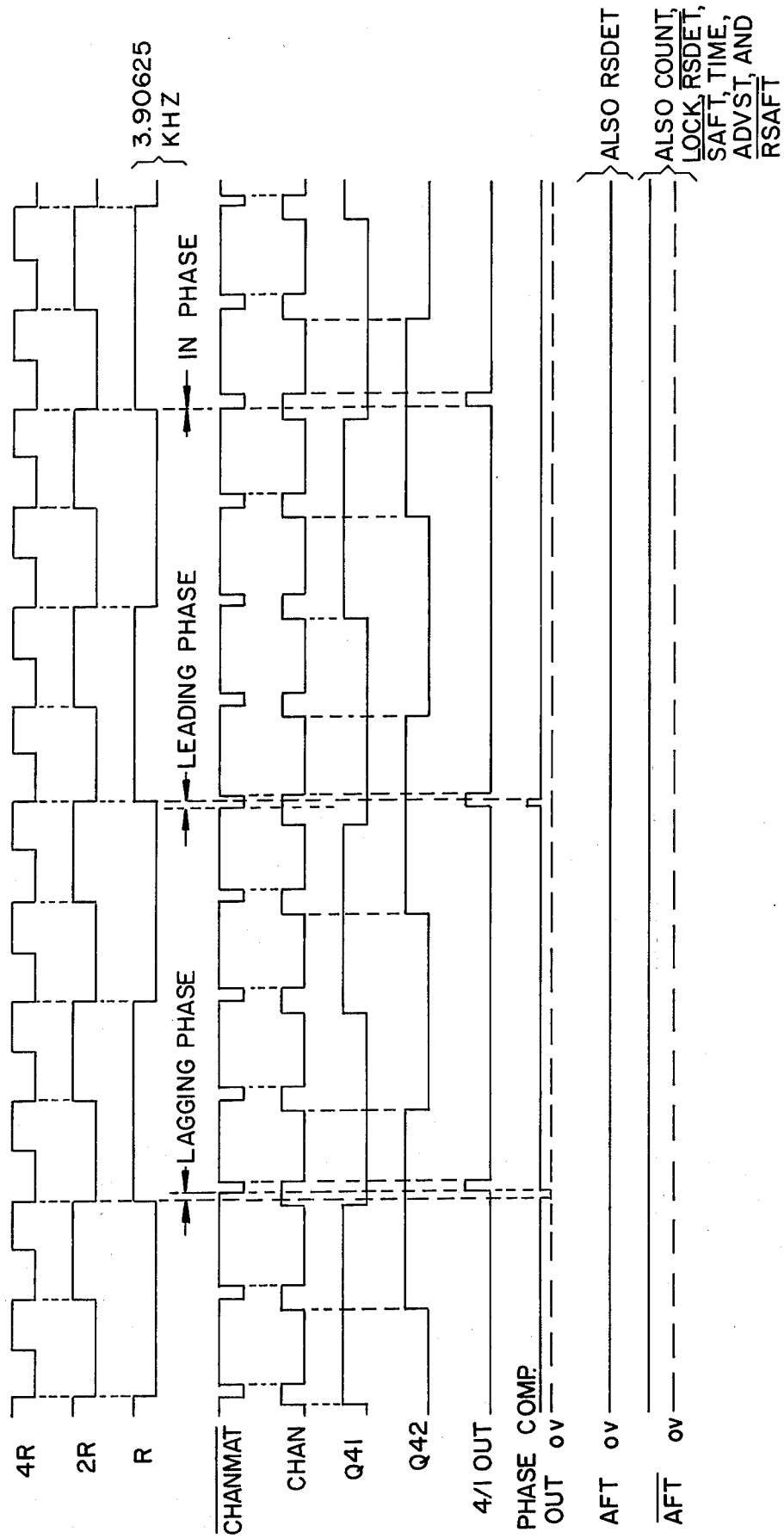

Referring now to the logic implementations shown in FIGS. 3, 5, 6 and 7 and the signals shown in FIG. 10, the specific manner in which a local oscillator frequency offset is evaluated during the discriminator control cycle will be described. The timing signal R/2, having a frequency equal to one-half the reference frequency, is coupled to mode control unit 72 from reference divider 38 where it is used to generate a signal COUNT. The COUNT signal is coupled to divide by N input switch 42. When the COUNT signal is high, the output signal of prescaler 28 is coupled to dual modulus divider 44. Conversely, when the COUNT signal is low, the output signal of prescaler 28 is not coupled to dual modulus divider 44. Thus, the COUNT signal is used to permit divide by N unit 30 to count only during alternate cycles of the reference frequency signal R.

Just prior to the positive-going transition of the COUNT signal, a positive-going pulse, RSDET (ReSet DETector) is coupled to divide by N control unit 58 from mode control unit 72, causing the signal CHAN to go high thereby initiating the channel number portion of the divide by N cycle, causing the signal DIV5 to go low thereby causing dual modulus divider to divide by 6 and generating a positive-going pulse, RSDD, thereby resetting dual decade counter 46 to a count of 00. The negative-going pulse, $\overline{\text{RSDET}}$ is used to reset divide by 4/divide by 1 divider 44 thereby causing the signal $Q_{41}$ to go low and the signal $Q_{42}$ to go high. The RSDET pulse is also coupled to the band decoder 50 to reset the four set-reset flip-flops and thus prepare it for band decoding. In summary, then, just prior to the COUNT signal going high, the divide by N unit is prepared to begin counting in the channel number portion of its cycle.

When the signal COUNT goes high, divide by N unit 30 begins counting in its normal fashion. During the fourth cycle of the CHAN signal, the signals $q_{41}$ and $Q_{42}$ derived by divider 44 are both high. In response, mode control unit 72 causes the signal $\overline{\text{INACMAT}}$ (INhibit Added Count MATch) to go low. As a result, added count comparator 54 prevents $\overline{\text{ACMAT}}$ from going to low when an added count match occurs and divide by N control unit 58 causes the added count portion of the divide by N cycle to continue. Furthermore, because the $\overline{\text{ACMAT}}$ signal is inhibited from going low, divide by N control unit 58 does not cause DIV5 to go low as it normally would in response to a low $\overline{\text{ACMAT}}$. As a result, dual modulus divider 44 continues to divide by 5.

When the signal COUNT goes low, the output of prescaler 28 is decoupled from divide by N unit 30 and divide by N unit 30 stops counting. This means that a count residue is preserved in dual modulus counter 44 and dual decade counter 46. However, divide by K prescaler 28 continues to count. The count residue in dual decade counter 46 correspond to the added count. If the count in prescaler 28 and the count residue in dual modulus divider 44 could be ignored, the residue in dual decade counter could be evaluated to determine how far the frequency of local oscillator 26 had drifted from its synthesized frequency, i.e., its offset.

Offset detector 78 includes combinational logic to examine the added count (AC) residue in dual decade counter 46. Offset detector 78 also includes a set-reset (S-R) flip-flop, comprising two cross-coupled NAND gates, at whose set (Q) output the signal <1.25 is developed. The signal CHAN is high whenever the divide by N cycle is in its channel number portion and is used to reset the S-R flip-flop causing the signal <1.25 to go low. Thus, at the beginning of the added count portion of the last (fourth) divide by N cycle during the period of the COUNT signal, the signal <1.25 is low.

Whenever the accumulated count in dual decade counter 46 equals the number A-2, an added count match occurs and an NGACMAT signal is coupled from added count comparator 54 to the S-R flip-flop of offset detector 78 to set the signal <1.25 high. However, if the local oscillator frequency is below the predetermined offset, the added count value of A-2 will not be reached during the duration of the COUNT signal and, as a result, the offset detector's flip-flop will not be set and the signal <1.25 will remain low. If on the other hand, if the local oscillator frequency is higher than its synthesized value, because $\overline{\text{ACMAT}}$ has been inhibited from going low, counting does not terminate if a match occurs in added count comparator 34 and the count in dual decade counter 46 continus to accumulate. If the count in dual decade counter 46 increases to a value A+1 corresponding to an offset of 1.25 MHz, the combinational logic of offset detector 78 detects the occurrence and the S-R is reset (after having been set when the value A-2 was reached) causing the signal <1.25 to go low. Table 4 below shows which causes the S-R flip-flop of offset detector 78 to be set and reset for the various bands.

TABLE 4

| VHF Band | Set <1.25 | Reset <1.25 |
|---|---|---|
| $V_{LL}$ | 15 | 18 |
| $V_{LH}$ | 16 | 19 |
| $V_H$ | 33 | 36 |

As earlier mentioned, when the COUNT signal goes low the local oscillator signal is decoupled from divide by N unit 30 and dula decade counter 46 stops counting. Furthermore, after a time delay to allow the logic circuitry to settle, the <1.25 signal coupled to mode control unit 72 is processed. If the <1.25 were high, discriminator control would be continued. On the other hand, if the <1.25 signal were low, discriminator control would be terminated and phase lock loop control would be initiated.

Unfortunately, the count in prescaler 28 and the residue in dual modulus divider 44 connot be ignored. Since the offset evaluation is only made when he local oscillator frequency, $f_0$, is near to its desired frequency where almost exactly four complete divide by N cycles occur during each count gate, mathematically, the effect of the count in prescaler 28 and the count residue in dual modulus divider 44 on the offset $\Delta f_{LO}$ may be expressed by the equation;

$$\Delta f_{LO} = [(x_f - x_i) + 64(y_f - y_i) + 64 \times 5 \times (AC-\lambda(A-1))]f_R \qquad (6)$$

where
- $x_i$ and $x_f$ are the counts of prescaler 28 at the start of an immediately following, respectively, the COUNT gating pulse;
- $y_i$ and $y_f$ are the counts of dual modulus divider 44 at the start of and immediately folowing, respectively, the COUNT gating pulse;
- AC is the added count in dual decade counter 46 immediately following the COUNT gating pulse (00 being the count in dual decade counter 46 at the start of the COUNT gating pulse since dual decade counter 46 has been reset); and
- (A−1) is the added count value for an offset of zero.

It is noted that if the effects of prescaler 28 and dual modulus divider 44 were ignored, i.e., it were assumed that $x_i = x_f$ and $y_i = y_f$, from equation (6) that each change in AC represents a 1.25 MHz change in local oscillator frequency. Further, from expression (6) it is seen that since the value of A−1 is dependent on the frequency band in which the selected channel resides but not on the selected channel, it is necessary to only couple band information, and not channel number information, to offset detector 78.

From equation (6) the maximum ambiguity because of the counts in prescaler 28 and the residue in dual modulus divider 44 may be determined. The worst case change in the count of prescaler 28 between the beginning and end of the COUNT gating pulse is a change of 63 counts since in the VHF band divide by K prescaler is programmed to count from 0 to 63, i.e., divide by a factor of 64. The worst case change in the residue in dual modulus counter 44 between the beginning and end of the COUNT gating pulse is a change of 4 counts since when the counting is stopped dual modulus divider 44 has been programmed to count from 0 to 4, i.e., divide by 5. Therefore, from equation (6), the maximum uncertainty in evaluation of the offset, $\Delta f_{LO}$, of the local oscillator frequency (when the reference frequency $f_R$, is 3.90625 KHz) is 1.25 MHz − 3.90625 KHz or approximately 1.25 MHz.

Due to the ambiguity of approximately 1.25 MHz discussed above, for any frequency counting sample, a high <1.25 signal indicates that the local oscillator frequency is within ±2.5 MHz of its originally synthesized value. Reduction of the ±2.5 MHz evaluation range to a ±1.25 MHz evaluation range is accomplished by making a number of evaluations rather than just one evaluation. If the local oscillator frequency drifts slightly more than 1.25 MHz from its synthesized value, most evaluations will indicate that the offset is less than 1.25 MHz. However, within a reasonable number of evaluations at least one evaluation will indicate that the offset is greater than 1.25 MHz. The duration of the time interval controlled by timer 74 of the tuning system is selected so that a sufficient number of evaluations can be made. For the tuning system whose logic implementation is shown in FIGS. 3–7, a predetermined time interval of 100 milliseconds has been found to provide suitable accuracy. As previously mentioned, if for any sample during the 100 millisecond time interval the signal <1.25 goes low, mode control unit 72 will cause step control unit 76 to advance the step state. Furthermore, if the signal <1.25 goes low at any time, mode control unit 72 will return local oscillator control to the phase locked loop.

For a more detailed explanation of the relationship between the number of samples taken and any error in the offset evaluation, reference should be made to concurrently filed U.S. Patent application Ser. No. 688,588 filed May 21, 1976, entitled "Frequency Counter For A Television Tuning System", by R. M. Rast, assigned to the same assignee as the present application, which is hereby incorporated by reference.

Although in FIG. 1 timer 74 and MATV switch 80 are shown as two separate units separately coupled to mode control unit 72, FIG. 7 it is seen that they are integrally arranged with respect to one another. As earlier described with reference to lock detector 70, timer 74 contains a retriggerable one-shot multivibrator comprising a cross-coupled type of set-reset (S-R) flip-flop. The reset (R) input of the flip-flop is coupled to the common junction of the series combination of a resistor and a capacitor. The series resistor-capacitor circuit is selectively coupled between a DC voltage source and ground through a single-pole double-throw switch which forms MATV switch 80. Two transmission (T) gates are coupled between the common junction of the series resistor-capacitor circuit (i.e., the flip-flop's R input) and ground. The control input of one transmission gate is coupled to the set (S) input of the flip-flop. The control input of the other transmission gate is coupled to the Q (Reset) output of the flip-flop.

Placing the switch in the MATV position provides a charging path for the capacitor. When mode control unit 72 generates a positive-going TRIGGER TIME pulse, the flip-flop is set and the signal, i.e., TIME, developed at its Q (set) output goes high while the signal developed at its Q (reset) output goes low. In response, the transmission gate coupled to the set output is turned off. The second transmission gate, connected to the set input is turned on for the duration of the TRIGGER TIME pulse. Following the pulse and second transmission gate turns off and the capacitor is allowed to charge. When the capacitor is charged to a voltage sufficient to reset the flip-flops, the signal TIME goes low. The predetermined time interval, e.g., 100 milliseconds, is determined by selecting the values of the resistor and the capacitor. The transmission gate coupled to the flip-flop's set input provides a retrigger capability.

When the MATV switch is in $\overline{\text{MATV}}$ position, the capacitor will never charge and as a result the predetermined time interval will have an infinite duration. Since mode control unit 72 will not initiate discriminator control until the predetermined time interval has ended (see the tuning algorithm shown in FIG. 2), the discriminator mode of local oscillator control is effectively disabled in this manner.

A major portion of the operation of mode control unit 72 has already been described in connection with the descriptions of the other portions of the tuning system. Therefore, the logic implementation of mode control unit 72 shown in FIG. 7 is described with reference to the various input and output signals of the other units of the tuning system coupled to mode control unit 72.

The generation of the signal COUNT is defined by the Boolean expression $$\overline{\text{ILLEGAL}} \cdot (\overline{\text{AFT}} + R/2) = \text{COUNT} \tag{7}$$

where the symbol (·) indicates a logic "and" function and the symbol (+) indicates a logic "or" function.

The conditions under which the retriggerable one-shot of timer 74 is triggered are given by the Boolean expression $$\text{Mode Transition} + \overline{\text{LOCK}} = \text{TRIGGER TIME} \tag{8}$$

From expression (8) it is seen that any change in the mode of operation (phase lock loop control to discriminator control or vice-versa) will cause the one-shot to be triggered. Furthermore, if the signal LOCK goes low, which can only occur during the phase lock loop control cycle, the one-shot wll be retriggered. Thus, during the phase locked loop control cycle, the signal TIME will not go low until approximately 100 milliseconds after the last transition of the signal LOCK form a low to a high state.

The following Boolean expression shows the signal conditions under which discriminator control is initiated:

$$\overline{\text{AFT}} \cdot V \cdot \overline{\text{TIME}} \cdot 4R \cdot \overline{2R} \cdot R \,\overline{R/2} = \overline{\text{SAFT}} \tag{9}$$

where a low $\overline{\text{SAFT}}$ (Set AFT) signal causes discriminator control to be initiated.

The following expression defines the generation of the RSDET pulse.

$$\text{AFT} \cdot 2R \cdot R \cdot \overline{R/2} = \text{RSDET} \tag{10}$$

The following two Boolean expressions illustrate the generation of the signal INHIBIT STEP.

$$\text{AFT} \cdot \overline{\text{TIME}} \cdot \overline{R} = \overline{\text{INHIBIT STEP}} \quad (11)$$
$$\text{CHANGE} = \overline{\text{INHIBIT STEP}} \quad (12)$$

As is indicated in expression 8, a transfer from the phase locked loop mode to the discriminator mode causes the one-shot of timer 74 to be triggered. If 100 milliseconds later the signal TIME goes low and the system has remained in the discriminator mode because discriminator 66 has detected a picture carrier, the signal INHIBIT STEP, is set thereby preventing further changes in the step state. If at a later time discriminator 66 loses control, e.g., due to a temporary RF signal drop-out, the system will revert to phase lock loop control without advancing the step state. Thus the system will search for the signal only at the previously determined step state, minimizing the possibility of discriminator 66 tuning local oscillator 26 to an adjacent channel sound carrier. The requirement that R be low in expression 11 ensures that the signal INHIBIT STEP is not set at the instant discriminator control is initiated but before the signal TIME has risen. As expression 12 indicates, the signal INHIBIT STEP is reset by the signal CHANGE, indicating that a new channel has been selected.

The following Boolan expression defines the generation of the INACMAT signal used in measuring the local oscillator frequency offset during discriminator control $$\text{AFT} \cdot Q_{4_1} \cdot Q_{4_2} \cdot \overline{\text{CHAN}} = \text{INACMAT} \quad (13)$$

The following expression defines the signal conditions for the generation of the negative-going ADVST pulse.

$$\text{AFT} \cdot \overline{<1.25} \cdot \overline{\text{INHIBIT STEP}} \cdot 4R \cdot \overline{R} \cdot \overline{R/2} = \text{ADVST} \quad (14)$$

The timing signal requirements ensure that the signal indication at the offset is greater than 1.25 MHz is valid by causing the evaluation to occur only after a delay after the signal COUNT has fallen and before phase locked loop control is reinitiated.

The following expression indicates the conditions under which phase locked loop control is initiated or reinitiated.

$$\text{CHANGE} + (\text{AFT} \cdot \overline{<1.25} \cdot 2R \cdot \overline{R} \cdot \overline{R/2}) = \overline{\text{RSAFT}} \quad (15)$$

where a low $\overline{\text{RSAFT}}$ (ReSEt AFT) causes discriminator control to be terminated and phase locked loop control to be initiated. The equation indicates that phase locked loop control is initiated whenever a new channel has been requested. The equation also shows that phase lock loop control is reinitiated when the offset has become greater than 1.25 MHz. The timing signals cause phase locked loop control to be initiated only when the offset evaluation is valid and after the decision to advance the step state has been made.

A logic implementation of step control unit 76 is shown in FIG. 4. Step control unit 76 includes two programmable D-type flip-flops coupled to sequence through the three step states corresponding to 0, +1 MHz and −1 MHz and then repeat. A change of state occurs on each positive-going transition of the ADVST pulse from mode control unit 72. When the signal CHANGE goes high indicating a change in the selected channel, step control unit 76 is reset to the 0 state. The STZ (STep Zero) output signal is high in the 0 state and low in the +1 and −1 states. The STM (STep Minus) output signal is high in the −1 state and low in the +1 and 0 states.

Figure 12:
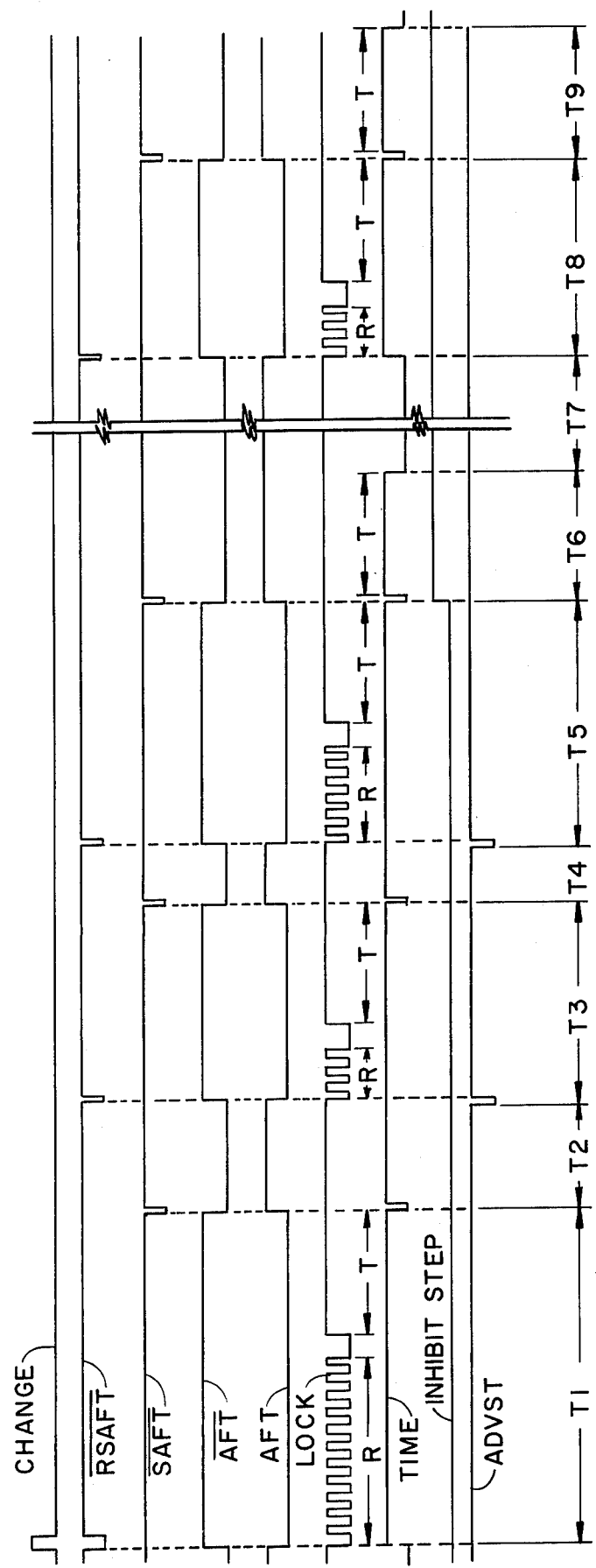

FIG. 12 shows various timing relationships between several waveforms referred to in the foregoing description and is useful in summarizing the operation of the tuning system which has been described. The waveforms illustrate the condition tuning algorithm where the selected channel has a nonstandard picture carrier at a frequency approximately 2 MHz lower than its associated standard frequency picture carrier.

The time period T1 illustrates the interval in which the nominal local oscillator frequency for a newly selected channel is synthesized by the phase locked loop (i.e., AFT is high). The time period T2 illustrates an interval in which, after the phase locked loop configuration is locked, the local oscillator frequency drifts away from its synthesized value because a carrier does not lie within ±1 MHz 45.75 MHz. Time period T3 illustrates the interval in which, the offset, having exceeded 1.25 MHz, an $\overline{\text{RSAFT}}$ signal (ReSet AFT) is generated causing the reinitiation of phase locked loop control and an ADVST signal is generated causing the local oscillator frequency to be synthesized at a frequency 1 MHz higher than its nominal value during the time period T1. The time period T4 illustrates an interval in which, after the phase locked loop has achieved lock with an incremented local oscillator frequency, the local oscillator frequency drifts away from its synthesized value again because no carrier lies within ±1 MHz of 45.75 MHz. The time period T5 illustrates the interval in which the local oscillator, again having exceeded an offset of 1.25 MHz, mode control unit 72 generates an $\overline{\text{RSAFT}}$ signal to reinitiate phase locked loop control and an ADVST signal to cause the local oscillator frequency to be synthesized at a value 1 MHz less than its nominal value. The time period T6 illustrates an interval in which the local oscillator signal, having been decremented by 1 MHz, causes a picture carrier to fall within the predetermined offset range of 1.25 MHz with the result that discriminator 66 tunes local oscillator 26 to it. The time interval T7 illustrates the expiration of the predetermined time interval (e.g., 100 milliseconds) while local oscillator 26 is under discriminator control causing the generation of an INHIBIT STEP. The time period T8 illustrates a time interval in which there is a momentary signal drop-out causing discriminator control to be terminated and phase locked loop to be reinitiated at the same local oscillator frequency as was synthesized in time period T5. The time period T9 illustrates an interval following a momentary drop-out in which the phase locked loop again becomes locked and discriminator control is again initiated. Since by time period T9, the signal has reappeated, local oscillator 26 will again be tuned as in intervals T6 and T7. If the signal has not reappeared, the tuning system will operate as in intervals T8 and T9 until the signal reappears. In FIG. 12 the interval R illustrates the interval during which the one-shot multivibrator of timer 74 is frequently retriggered by the LOCK signal. The interval T, e.g., 100 milliseconds, corresponds to the predetermined time interval which is triggered by the signals $\overline{\text{SAFT}}$ (Set AFT), the signal $\overline{\text{RSAFT}}$ or the signal $\overline{\text{LOCK}}$.

What is claimed is:

1. Apparatus for tuning a receiver to a selected channel, comprising:

input means for receiving an information bearing radio frequency carrier;

local oscillator means for generating a local oscillator signal;

mixer means for combining said radio frequency carrier and said local oscillator signal to derive an intermediate frequency information bearing carrier;

first means for tuning the frequency of said local oscillator signal to the nominal local oscillator frequency allocated to said selected channel;

second means for tuning said local oscillator signal to minimize a deviation between the frequency of said intermediate frequency carrier and a nominal intermediate frequency carrier;

control means for selectively coupling either said first means or said second means to said local oscillator, said control means initially coupling said first means to said local oscillator means when said selected channel is selected;

lock detection means for generating a lock signal when said means has substantially tuned the frequency of said local oscillator signal to said nominal local oscillator frequency, said control means coupling said second means to said local oscillator means in response to said lock signal;

offset detection means for generating an offset signal when the frequency of said local oscillator signal is more than a predetermined offset from the frequency of said local oscillator signal generated when said first means was coupled to said local oscillator, said control means coupling said first means to said local oscillator means in response to said offset signal; and means coupled to said first means for generating a step signal in response to said offset signal, said first means tuning the frequency of said local oscillator signal to a frequency differing by an incremental amount from the frequency of said local oscillator signal during the initial interval in which said local oscillator means is under the control of said first means.

2. The apparatus recited in claim 1 wherein said second means includes discriminator means.

3. The apparatus recited in claim 1 wherein said first means includes phase locked loop means.

4. The apparatus recited in claim 3 wherein said second means includes frequency discriminator means.

5. The apparatus recited in claim 4 wherein said information bearing intermediate frequency carrier is a picture carrier.

6. The apparatus recited in claim 5 wherein said predetermined frequency offset is less than the spacing between the intermediate frequency picture carrier of a selected channel and the nearest undesired carrier to the intermediate frequency picture carrier of the selected channel.

7. The apparatus recited in claim 5 wherein said phase locked loop means tunes the frequency of said local oscillator signal to a frequency differing from the frequency of said local oscillator signal generated during the initial control of said phase locked loop means by a first incremental amount in response to the first occurrence of said offset signal and tunes the frequency of said local oscillator signal to a frequency differing from the frequency of said local oscillator signal generated during the initial control of said phase locked loop means by a second incremental amount in response to the second occurrence of said offset signal.

8. The apparatus recited in claim 7 wherein the frequency of said local oscillator is incremented in response to the first occurrence of said offset signal and decremented in response to the second occurrence of said offset signal.

9. The apparatus recited in claim 5 further including means for inhibiting said control means from coupling said discriminator means to said local oscillator means.

10. The apparatus recited in claim 9 wherein said means for inhibiting said control means from coupling said discriminator means to said local oscillator means includes manual switching means.

11. The apparatus recited in claim 5 wherein said means for generating said step signal generates said step signal when said offset signal has been generated within a predetermined time interval.

12. The apparatus recited in claim 11 wherein said means for generating said step signal inhibits the generation of said signal when said offset signal has been generated after said predetermined time interval.

13. The apparatus recited in claim 12 further including drift control means for causing the frequency of said local oscillator signal to drift in a predetermined direction, said control means being coupled to said local oscillator in response to said lock signal.

14. The apparatus recited in claim 13 wherein said discriminator means and said drift control means are coupled to said local oscillator means through low pass filter means;

said drift control means includes a source of direct voltage;

said discriminator means derives an error voltage in accordance with the frequency deviation between said intermediate frequency picture carrier and said nominal intermediate frequency picture carrier; and said error voltage has an amplitude selected with respect to the amplitude of said direct voltage to inhibit the frequency of said local oscillator from drifting when the frequency of said intermediate frequency picture carrier is within a predetermined frequency deviation from said nominal intermediate frequency picture carrier.

* * * * *

UNITED STATES PATENT OFFICE
CERTIFICATE OF CORRECTION

PATENT NO. : 4,031,549

DATED : June 21, 1977

INVENTOR(S) : Robert Morgan Rast, et al.

It is certified that error appears in the above-identified patent and that said Letters Patent are hereby corrected as shown below:

Column 1, line 57, that portion reading "being" should read -- bring --. Column 5, line 48, after "signals" and before "are" insert -- of divide by 4/divide by 1 divider 32 and reference oscillator 38. When these two signals --. Column 7, line 42, that portion reading "that the frequency" should be deleted; line 61, that portion reading "<1.25" should read -- $\overline{<1.25}$ --; line 64, that portion reading "<1.25" should read -- $\overline{<1.25}$ --; line 66, that portion reading "1.25" should read -- $\overline{<1.25}$ --. Column 9, line 43, after "±1 MHz" and before "when" insert -- of 45.75 MHz --. Column 13, line 65, that portion reading "84" should read -- $\overline{84}$ --; line 67, after "Added" and before "comparator" insert -- count --. Column 20, line 21, that portion reading "dula" should read -- dual --; line 30, that portion reading "connot" should read--cannot --; line 31, that portion reading "he" should read -- the --; line 39, that portion reading "(AC-λ" should read -- (AC- --. Column 21, line 65, that portion reading "Q" should read -- $\overline{Q}$ --. Column 22, line 43, that portion reading "Q" should read -- $\overline{Q}$ --; line 53, that portion reading "form" should read -- from --. Column 23, line 25,

UNITED STATES PATENT OFFICE
CERTIFICATE OF CORRECTION

PATENT NO. : 4,031,549

DATED : June 21, 1977

INVENTOR(S) : Robert Morgan Rast, et al.

It is certified that error appears in the above-identified patent and that said Letters Patent are hereby corrected as shown below:

that portion reading "Boolan" should read -- Boolean --. Column 25, line 23, after "said" and before "means" insert -- first --. Column 26, line 33, after "said" and before "signal" insert -- step --; line 38, after "said" and before "control" insert -- drift --.

Signed and Sealed this

Eighth Day of November 1977

[SEAL]

Attest:

RUTH C. MASON
Attesting Officer

LUTRELLE F. PARKER
Acting Commissioner of Patents and Trademarks